United States Patent
Tokida et al.

(10) Patent No.: US 9,297,635 B2
(45) Date of Patent: Mar. 29, 2016

(54) MAGNETIC SENSOR SYSTEM INCLUDING TWO DETECTION CIRCUITS

(71) Applicant: TDK CORPORATION, Tokyo (JP)

(72) Inventors: Homare Tokida, Tokyo (JP); Satoshi Abe, Tokyo (JP); Hiroshi Yamazaki, Tokyo (JP); Takahiro Imai, Tokyo (JP)

(73) Assignee: TDK CORPORATION, Tokyo (JP)

( * ) Notice: Subject to any disclaimer, the term of this patent is extended or adjusted under 35 U.S.C. 154(b) by 111 days.

(21) Appl. No.: 14/164,776

(22) Filed: Jan. 27, 2014

(65) Prior Publication Data

US 2014/0292314 A1  Oct. 2, 2014

(30) Foreign Application Priority Data

Mar. 29, 2013 (JP) .................................. 2013-073683

(51) Int. Cl.
| | |
|---|---|
| *G01D 5/244* | (2006.01) |
| *G01R 35/00* | (2006.01) |
| *G01B 7/14* | (2006.01) |
| *G01R 33/09* | (2006.01) |
| *G01D 5/245* | (2006.01) |

(52) U.S. Cl.
CPC ............... *G01B 7/14* (2013.01); *G01D 5/2451* (2013.01); *G01D 5/24461* (2013.01); *G01D 5/24466* (2013.01); *G01R 33/093* (2013.01)

(58) Field of Classification Search
CPC ..... G01R 33/09; G01R 33/093; G01R 33/098
USPC ............ 324/207.21, 252, 331, 345, 377, 463, 324/200, 219, 529, 754.17; 338/32 R
See application file for complete search history.

(56) References Cited

U.S. PATENT DOCUMENTS

| | | | | |
|---|---|---|---|---|
| 4,626,781 A | * | 12/1986 | Forkel ..................... | B60T 8/171 310/155 |
| 2012/0176126 A1 | | 7/2012 | Naganuma et al. | |

FOREIGN PATENT DOCUMENTS

| | | | |
|---|---|---|---|
| JP | A-64-80817 | 3/1989 | |
| JP | H0638483 A | 2/1994 | |
| JP | 08178937 | * 7/1996 | .............. G01P 3/488 |
| JP | 2001-217478 A | 8/2001 | |

(Continued)

OTHER PUBLICATIONS

Nakamura, Tokuo, Sep. 2011,Japan, A.*
Nishiguchi et al., Apr. 2006, Japan, A.*
Kyo et al., Jun. 2009, Japan, A.*
Harumi et al., Jul. 1996, Japan.*

(Continued)

*Primary Examiner* — Patrick Assouad
*Assistant Examiner* — Taqi Nasir
(74) *Attorney, Agent, or Firm* — Oliff PLC

(57) ABSTRACT

A magnetic sensor system includes a scale and a magnetic sensor arranged in a relative positional relationship variable in a first direction, and a computing unit. The magnetic sensor includes a first detection circuit disposed at a first position and a second detection circuit disposed at a second position. Each of the first and second detection circuits includes a spin-valve magnetoresistive element. The difference between the first position and the second position in the first direction is smaller than or equal to 1.25% of a one-pitch amount of change in the relative positional relationship between the scale and the magnetic sensor. The computing unit generates an abnormal-event determination signal indicative of the presence of an abnormal event in the magnetic sensor by computation using detection signals from the first and second detection circuits.

8 Claims, 19 Drawing Sheets

(56) References Cited

FOREIGN PATENT DOCUMENTS

| JP | A-2003-194598 | | | 7/2003 | | |
| --- | --- | --- | --- | --- | --- | --- |
| JP | 2006105932 | A | * | 4/2006 | ............ | G01R 35/00 |
| JP | A-2006-105932 | | | 4/2006 | | |
| JP | 2008107266 | A | | 5/2008 | | |
| JP | 2009133751 | A | * | 6/2009 | ............ | G01D 5/245 |
| JP | A-2009-133751 | | | 6/2009 | | |
| JP | 2011185747 | A | * | 9/2011 | ............ | G01D 5/244 |
| JP | A-2011-185747 | | | 9/2011 | | |
| JP | 2011215026 | A | | 10/2011 | | |
| JP | 2012-145425 | A | | 8/2012 | | |

OTHER PUBLICATIONS

Mar. 18, 2015 Office Action (Decision of Rejection) issued in Japanese Patent Application No. 2013-073683.

Mar. 18, 2015 Office Action (Decision to Dismiss the Amendment) issued in Japanese Patent Application No. 2013-073683.

Dec. 2, 2014 Office Action issued in Japanese Application No. 2013-073683.

Mar. 25, 2014 Office Action issued in Japanese Patent Application No. 2013-073683 (with English translation).

* cited by examiner

MAGNETIC SENSOR SYSTEM INCLUDING TWO DETECTION CIRCUITS

BACKGROUND OF THE INVENTION

1. Field of the Invention

The present invention relates to a magnetic sensor system for detecting a physical quantity associated with the relative positional relationship between a scale and a magnetic sensor.

2. Description of the Related Art

In recent years, magnetic sensor systems have been employed to detect a physical quantity associated with the rotational movement or linear movement of a moving object in a variety of applications. Typically, a magnetic sensor system includes a scale and a magnetic sensor, and the magnetic sensor is configured to generate a signal associated with the relative positional relationship between the scale and the magnetic sensor.

The scale of the magnetic sensor system for use with a rotationally moving object is, in general, a rotating body that moves in response to the movement of the moving object. The rotating body can be, for example, a multipole-magnetized magnet having a plurality of pairs of N and S poles alternately arranged in a circumferential direction, or a gear having teeth formed of a magnetic material. In this case, the magnetic sensor system detects, for example, the rotational position and/or the rotational speed of the rotating body as the physical quantity.

The scale of the magnetic sensor system for use with a linearly moving object is, for example, a linear scale having a plurality of pairs of N and S poles arranged alternately in a linear configuration. In such a case, one of the linear scale and the magnetic sensor moves in response to the movement of the moving object, and the magnetic sensor system detects the relative position and/or speed of the linear scale with respect to the magnetic sensor as the physical quantity.

The magnetic sensor system is used, for example, in automobiles in order to detect the rotational speed of the axle shaft, the angle of the crank, the cam angle and so on. The magnetic sensor system for use with automobiles, in particular, is required to include means for detecting an abnormal event in the magnetic sensor.

JP 2003-194598A discloses an abnormal-event detector including a first sensor and a second sensor whose output values responsive to a change in physical quantity have mutually opposite output characteristics. The abnormal-event detector determines that one of the first and second sensors is abnormal when a total output value obtained by adding the output values of the first and second sensors is not a constant value. In this abnormal-event detector, the first sensor includes a first detection circuit, and the second sensor includes a second detection circuit. The first detection circuit and the second detection circuit are disposed to be adjacent to each other on one plane. Each detection circuit includes a bridge circuit constituted of four resistors. Each resistor is formed by depositing a thin film of NiCo in a staggered configuration on a substrate, and can be said to be an anisotropic magnetoresistive element.

The abnormal-event detector disclosed in JP 2003-194598A is configured so that, on the precondition that the direction of a magnetic flux passing through the first detection circuit and the direction of a magnetic flux passing through the second detection circuit are the same, the respective output values of the first sensor and the second sensor have mutually opposite output characteristics. The four resistors (anisotropic magnetoresistive elements) included in each detection circuit require a relatively large footprint. This leads to a relatively large difference in position between the first detection circuit and the second detection circuit. This abnormal-event detector is suitable for a system in which magnetic fluxes pass in the same direction through a wide range so that the magnetic flux passing through the first detection circuit and the magnetic flux passing through the second detection circuit are in the same direction. However, it is practically difficult to apply this detector to the aforementioned magnetic sensor system including the scale and the magnetic sensor. The reason for this will be described below.

In the aforementioned magnetic sensor system, continuous changes in the relative positional relationship between the scale and the magnetic sensor cause periodic changes in the direction of a magnetic field at a certain point in the magnetic sensor. Herein, the amount of a change in the relative positional relationship between the scale and the magnetic sensor that changes the direction of the magnetic field at a certain point by one period is referred to as one pitch. The abnormal-event detector disclosed in JP 2003-194598A may be applied to the magnetic sensor system so that the magnetic sensor includes the first and second detection circuits disclosed in JP 2003-194598A. In such a case, the difference between the positions of the first and second detection circuits would be significantly greater compared with one pitch. This would cause a significant difference between the direction of the magnetic flux passing through the first detection circuit and the direction of the magnetic flux passing through the second detection circuit. As a result, the respective output values of the first sensor and the second sensor could not have mutually opposite output characteristics. This would in turn cause the total output value not to be a constant value even when neither of the first and second sensors has any abnormal event, thus making it impossible to determine the presence of an abnormal event in the first or second sensor.

To cope with this, first and second sensors of the same configuration can conceivably be disposed apart from each other by ½ pitch to allow the output values of the first and second sensors to have mutually opposite output characteristics so that the presence of an abnormal event in the first or second sensor can be determined from the total output value. In this case, however, there is a problem as follows. In the case of a magnetic sensor system, the scale may differ depending on the system to which the magnetic sensor system is applied, and the magnitude of one pitch can vary accordingly. Thus, even if the first and second sensors are disposed apart from each other by ½ pitch in accordance with a certain scale to construct a magnetic sensor system, a change in the magnitude of one pitch resulting from a change of the scale would cause the difference between the positions of the first and second sensors not to be ½ pitch any longer. This would in turn cause the total output value not to be a constant value even when neither of the first and second sensors has any abnormal event, thus making it impossible to determine the presence of an abnormal event in the first or second sensor.

OBJECT AND SUMMARY OF THE INVENTION

It is an object of the present invention to provide a magnetic sensor system including a scale and a magnetic sensor and capable of determining the presence of an abnormal event in the magnetic sensor.

A magnetic sensor system of the present invention includes a scale and a magnetic sensor that are arranged in a relative positional relationship variable in a first direction, and is configured to detect a physical quantity associated with the relative positional relationship between the scale and the magnetic sensor. In the magnetic sensor system of the present invention, the magnetic sensor includes a first detection circuit disposed at a first position and a second detection circuit disposed at a second position. The first detection circuit outputs a first detection signal that varies depending on a first magnetic field applied to the first detection circuit. The second detection circuit outputs a second detection signal that varies depending on a second magnetic field applied to the second detection circuit. Each of the first and second detection circuits includes a magnetoresistive element. The magnetoresistive element includes: a magnetization pinned layer having a magnetization in a pinned direction; a free layer having a magnetization that varies depending on an applied magnetic field; and a nonmagnetic layer interposed between the magnetization pinned layer and the free layer. Each of the first and second magnetic fields changes its direction periodically in response to a change in the relative positional relationship between the scale and the magnetic sensor. The first position and the second position differ from each other by 1.25% of one pitch or less, where one pitch is an amount of a change in the relative positional relationship between the scale and the magnetic sensor that changes the direction of each of the first and second magnetic fields by one period. The magnetic sensor system further includes a computing unit that generates an abnormal-event determination signal indicative of the presence of an abnormal event in the magnetic sensor by computation using the first detection signal and the second detection signal.

In the magnetic sensor system of the present invention, the second detection signal may have a phase difference of 175.5° to 184.5° with respect to the first detection signal. In such a case, the computation by the computing unit may include determining the sum of the first detection signal and the second detection signal.

In the magnetic sensor system of the present invention, the second detection signal may have a phase difference of −4.5° to 4.5° with respect to the first detection signal. In such a case, the computation by the computing unit may include determining the difference between the first detection signal and the second detection signal.

In the magnetic sensor system of the present invention, the first position and the second position may be the same in the first direction.

In the magnetic sensor system of the present invention, the scale may be a rotating body that rotates about a predetermined central axis. In such a case, the rotation of the rotating body changes the relative positional relationship between the scale and the magnetic sensor. The first direction is the direction of rotation of the rotating body. The one pitch is expressed in an angle in the direction of rotation of the rotating body.

The rotating body may have a plurality of pairs of N and S poles alternately arranged in a circumferential direction. In such a case, each of the first and second magnetic fields is produced by the rotating body and changes its direction as the rotating body rotates. The one pitch is the angle formed by two straight lines that connect the central axis to centers of two adjacent N poles of the rotating body.

The rotating body may be a gear having teeth formed of a magnetic material. The magnetic sensor system may further include a magnet having a fixed positional relationship with the magnetic sensor. In such a case, each of the first and second magnetic fields is produced by the magnet and changes its direction as the gear rotates. The one pitch is the angle formed by two straight lines that connect the central axis to centers of two adjacent teeth.

In the magnetic sensor system of the present invention, the scale may have a plurality of pairs of N and S poles arranged alternately in a linear configuration. In such a case, the first direction is the direction in which the N and S poles of the scale are arranged. Each of the first and second magnetic fields is produced by the scale. The one pitch is the distance between centers of two adjacent N poles of the scale.

In the magnetic sensor system of the present invention, the nonmagnetic layer of the magnetoresistive element may be a tunnel barrier layer.

In the magnetic sensor system of the present invention, each of the first and second detection circuits includes a so-called spin-valve magnetoresistive element, that is, a magnetoresistive element including a magnetization pinned layer, a free layer and a nonmagnetic layer. The spin-valve magnetoresistive element allows for a significant reduction in footprint when compared with the anisotropic magnetoresistive element. The present invention thus allows the first and second detection circuits to be disposed such that the difference between the first position and the second position is 1.25% of one pitch or less, as long as the magnitude of one pitch falls within a practical range. Thus, the present invention makes it possible that, for the magnetic sensor system including the scale and the magnetic sensor, the presence of an abnormal event in the magnetic sensor can be determined from the abnormal-event determination signal generated by computation using the first detection signal and the second detection signal.

Other and further objects, features and advantages of the present invention will appear more fully from the following description.

DETAILED DESCRIPTION OF THE PREFERRED EMBODIMENTS

[First Embodiment]

Figure 1:
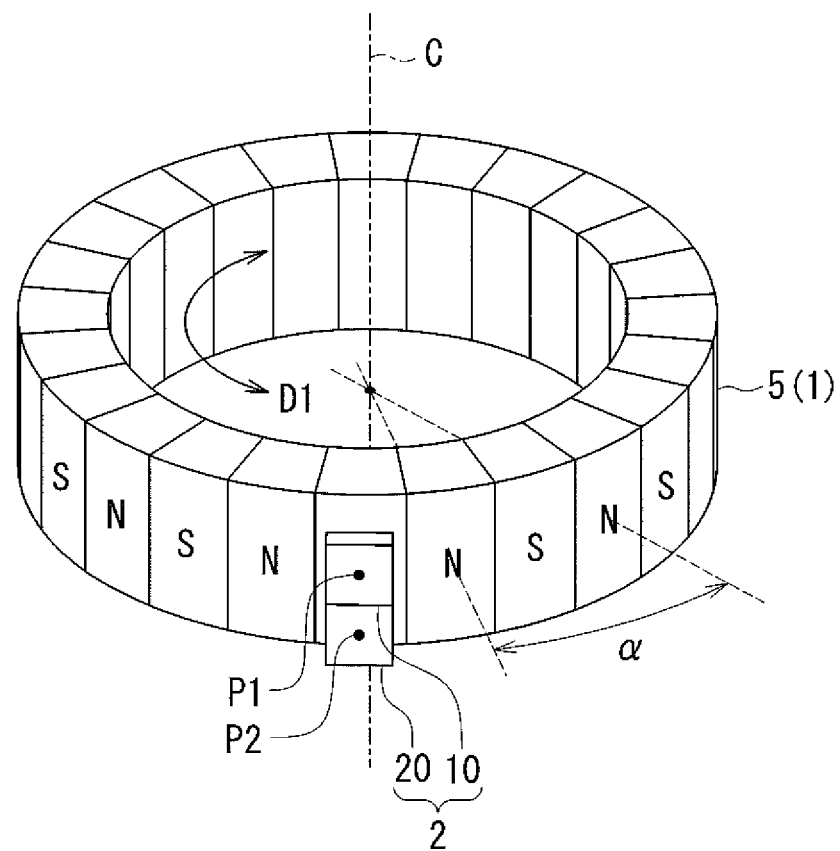
FIG. 1 is a perspective view illustrating the general configuration of a magnetic sensor system according to a first embodiment of the invention.
Figure 2:
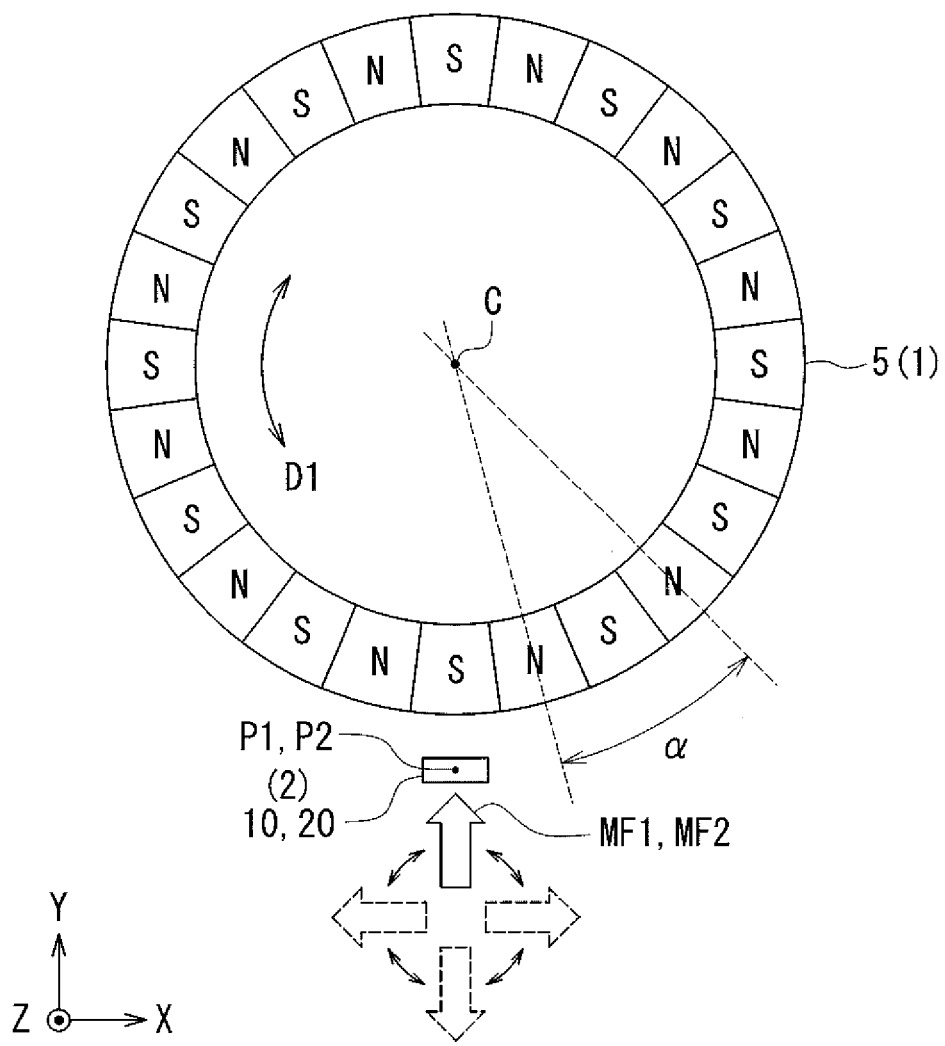
FIG. 2 is a plan view illustrating the general configuration of the magnetic sensor system according to the first embodiment of the invention.
Figure 3:
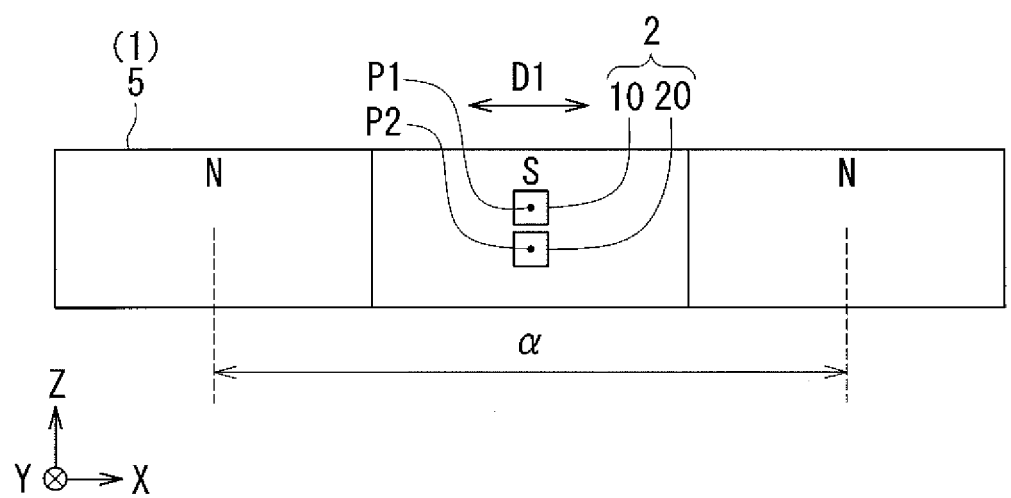
FIG. 3 is a side view illustrating a scale and first and second detection circuits of the first embodiment of the invention.

Preferred embodiments of the present invention will now be described in detail with reference to the drawings. First, reference is made to FIG. 1 to FIG. 3 to describe the general configuration of a magnetic sensor system according to a first embodiment of the invention. FIG. 1 is a perspective view illustrating the general configuration of the magnetic sensor system according to the first embodiment. FIG. 2 is a plan view illustrating the general configuration of the magnetic sensor system according to the first embodiment. FIG. 3 is a side view illustrating a scale and first and second detection circuits of the first embodiment.

As shown in FIG. 1 to FIG. 3, the magnetic sensor system according to the first embodiment includes a scale 1 and a magnetic sensor 2 that are arranged in a relative positional relationship variable in a first direction D1, and is configured to detect a physical quantity associated with the relative positional relationship between the scale 1 and the magnetic sensor 2. The scale 1 of the first embodiment is a rotating body that rotates about a predetermined central axis C in response to the movement of a rotationally moving object (not illustrated). The rotation of the rotating body changes the relative positional relationship between the scale 1 and the magnetic sensor 2. The first direction D1 is the direction of rotation of the rotating body. The magnetic sensor system detects, for example, the rotational position and/or the rotational speed of the rotating body as the physical quantity.

As shown in FIG. 1 and FIG. 2, the rotating body of the first embodiment is a multipole-magnetized magnet 5 having a plurality of pairs of N and S poles alternately arranged in a circumferential direction. In the example shown in FIG. 1 and FIG. 2, the magnet 5 has 12 pairs of N and S poles. The magnetic sensor 2 is disposed to face the outer circumferential surface of the magnet 5.

Now, the definition of directions in the first embodiment will be described with reference to FIG. 1 and FIG. 2. First, the direction parallel to the central axis C shown in FIG. 1 and from bottom to top in FIG. 1 is defined as the Z direction. In FIG. 2, the Z direction is shown as the direction out of the plane of FIG. 2. Next, two directions that are perpendicular to the Z direction and orthogonal to each other are defined as the X direction and the Y direction. In FIG. 2, the X direction is shown as the rightward direction, and the Y direction is shown as the upward direction. Further, the direction opposite to the X direction is defined as the −X direction, and the direction opposite to the Y direction is defined as the −Y direction.

The magnetic sensor 2 includes a first detection circuit 10 and a second detection circuit 20. To facilitate understanding, in FIG. 1 and FIG. 2 the first and second detection circuits 10 and 20 are depicted as being larger compared to those in FIG. 3. Further, although the first and second detection circuits 10 and 20 are depicted as separate components in FIG. 1, they may be integrated into a single component. Further, although the first and second detection circuits 10 and 20 are arranged in the vertical direction in FIG. 1 and FIG. 3, the order of arrangement may be reversed from that shown in FIG. 1 and FIG. 3.

The first detection circuit 10 is disposed at a first position P1, detects a first magnetic field MF1 applied to the first detection circuit 10, and outputs a first detection signal S1 that varies depending on the first magnetic field MF1. The second detection circuit 20 is disposed at a second position P2, detects a second magnetic field MF2 applied to the second detection circuit 20, and outputs a second detection signal S2 that varies depending on the second magnetic field MF2. In FIG. 1 to FIG. 3, the first position P1 is shown as the position of the center of the first detection circuit 10, while the second position P2 is shown as the position of the center of the second detection circuit 20.

In the first embodiment, as shown in FIG. 2 and FIG. 3, the first position P1 and the second position P2 are the same in the first direction D1. Consequently, the first magnetic field MF1 and the second magnetic field MF2 are in substantially the same direction. In the example shown in FIG. 2 and FIG. 3, the first position P1 and the second position P2 are the same in the X and Y directions, and different in the Z direction.

Each of the first magnetic field MF1 and the second magnetic field MF2 changes its direction periodically in response to a change in the relative positional relationship between the scale 1 and the magnetic sensor 2. In the first embodiment, each of the first and second magnetic fields MF1 and MF2 is produced by the magnet 5 and changes its direction as the rotating body or the magnet 5 rotates. In FIG. 2, the hollow arrow labeled MF1, MF2 indicates the direction of the first and second magnetic fields MF1 and MF2 when the relative positional relationship between the scale 1 and the magnetic sensor 2 is as shown in FIG. 2. The broken arrows illustrate changes in the direction of the first and second magnetic fields MF1 and MF2 as the magnet 5 rotates from the position shown in FIG. 2. The direction of the first magnetic field MF1 rotates about the first position P1 in the XY plane. The direction of the second magnetic field MF2 rotates about the second position P2 in the XY plane.

Herein, the amount of a change in the relative positional relationship between the scale 1 and the magnetic sensor 2 that changes the direction of each of the first magnetic field MF1 and the second magnetic field MF2 by one period is defined as one pitch. In the first embodiment, one pitch is expressed in an angle in the direction of rotation of the rotating body or the magnet 5. Specifically, one pitch is the angle formed by two straight lines that connect the central axis C to the centers of two adjacent N poles of the magnet 5. In FIG. 1 and FIG. 2, the aforementioned two straight lines are shown in broken lines and the angle formed by the two straight lines is denoted by symbol α. In the example shown in FIG. 1 and FIG. 2, the angle α is 30°. In this example, one rotation of the magnet 5 causes the direction of each of the first magnetic field MF1 and the second magnetic field MF2 to rotate 12 times, that is, to change by 12 periods. One period of the first and second detection signals S1 and S2, i.e., an electrical angle of 360°, is equivalent to a ¹⁄₁₂ rotation of the magnet 5, i.e., a 30-degree angle of rotation of the magnet 5.

In the first embodiment, the difference between the first position P1 and the second position P2 in the first direction D1, which will hereinafter be referred to as the positional difference, is defined by an angle in the direction of rotation of the rotating body or the magnet 5, the angle being formed by two straight lines that connect the central axis C to the first and second positions P1 and P2. As will be described later in relation to another embodiment, it is required that the positional difference be 1.25% of one pitch or less. In the example shown in FIG. 1 and FIG. 2, since one pitch or the angle α is 30°, the positional difference needs to be 0.375° or less. In the first embodiment, since the first position P1 and the second position P2 are the same in the first direction D1, the positional difference is 0° and thus satisfies the above-described requirement. In consideration of the production accuracy of the magnetic sensor system and other factors, the first position P1 and the second position P2 may slightly differ from each other in the first direction D1 to such an extent that the positional difference is 1.25% of one pitch or less.

The first detection circuit 10 and the second detection circuit 20 each include magnetoresistive (MR) elements. As will be described in detail later, all the MR elements included in the first and second detection circuits 10 and 20 of the first embodiment are spin-valve MR elements. Each of the MR elements includes a magnetization pinned layer having a magnetization in a pinned direction, a free layer having a magnetization that varies depending on an applied magnetic field, and a nonmagnetic layer interposed between the magnetization pinned layer and the free layer. The first detection circuit 10 is disposed such that the plane of the layers constituting each MR element is perpendicular to a straight line connecting the first position P1 and the central axis C. The second detection circuit 20 is disposed such that the plane of the layers constituting each MR element is perpendicular to a straight line connecting the second position P2 and the central axis C. In the first embodiment, the plane of the layers constituting each MR element of the second detection circuit 20 is parallel to the plane of the layers constituting each MR element of the first detection circuit 10.

An anisotropic magnetoresistive element is constituted of an elongated conductive path of a magnetic material, and thus requires a relatively large footprint. In contrast, a spin-valve MR element includes a plurality of stacked layers and can be supplied with a current in a direction perpendicular to the plane of those layers, thus allowing for a significant reduction in footprint when compared with the anisotropic magnetoresistive element. Further, although small in size, the spin-valve MR element is highly sensitive to magnetic fields. Thus, the first embodiment makes it possible to bring the first detection circuit 10 and the second detection circuit 20 into sufficiently close proximity to each other so as to satisfy the aforementioned requirement.

The magnetic sensor system further includes a computing unit 30 to generate an abnormal-event determination signal indicative of the presence of an abnormal event in the magnetic sensor 2 by computation using the first detection signal S1 and the second detection signal S2. The computing unit 30 will be described in detail later.

Figure 4:
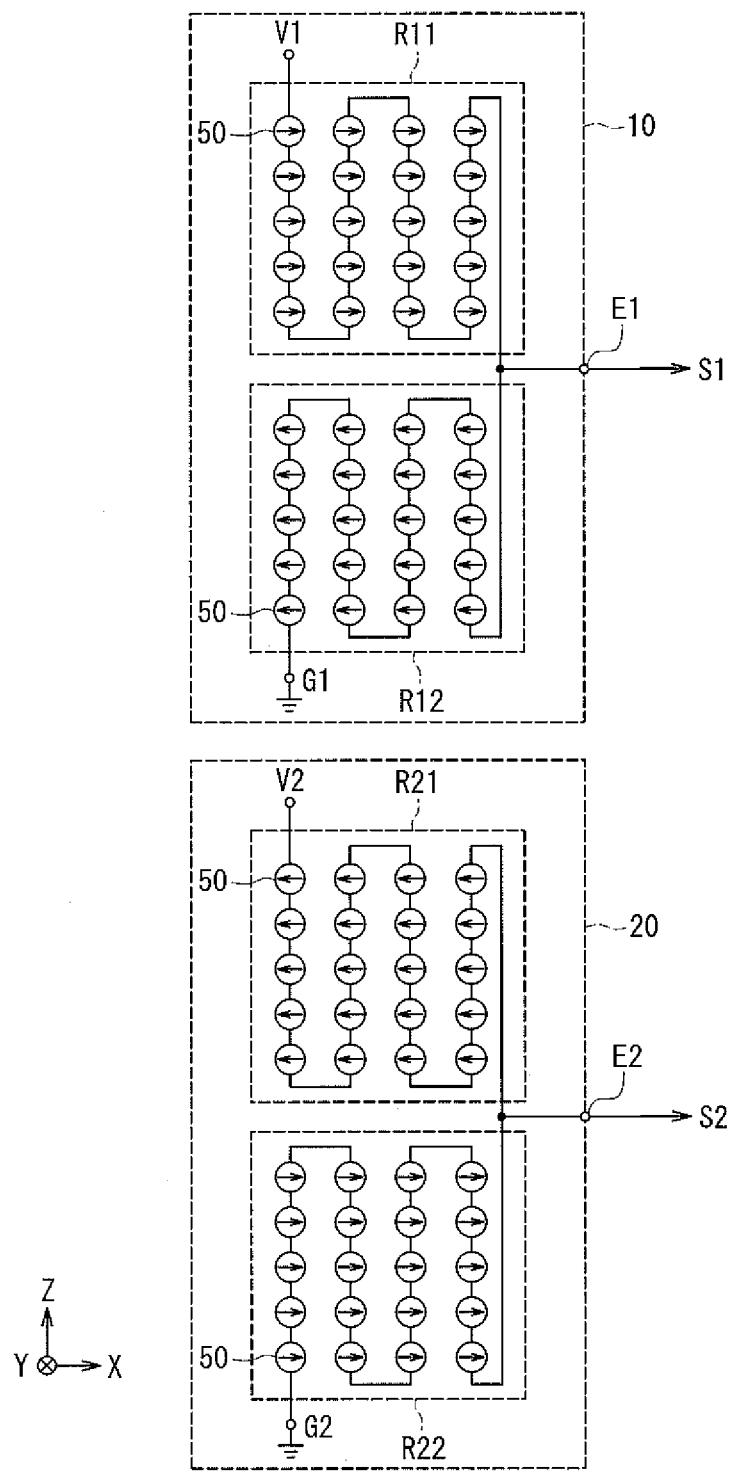
FIG. 4 is a plan view illustrating the first and second detection circuits of the first embodiment of the invention.

The configurations of the first and second detection circuits 10 and 20 will now be described in detail with reference to FIG. 4. FIG. 4 is a plan view illustrating the first and second detection circuits 10 and 20. The first detection circuit 10 includes MR element arrays R11 and R12 connected in series, a power supply port V1, a ground port G1, and an output port E1. Each of the MR element arrays R11 and R12 includes a plurality of MR elements 50 connected in series. A first end of the MR element array R11 is connected to the power supply port V1. A second end of the MR element array R11 is connected to a first end of the MR element array R12 and the output port E1. A second end of the MR element array R12 is connected to the ground port G1. A power supply voltage of a predetermined magnitude is applied to the power supply port V1. The ground port G1 is grounded. The output port E1 outputs the first detection signal S1.

The second detection circuit 20 has a similar configuration to that of the first detection circuit 10. More specifically, the second detection circuit 20 includes MR element arrays R21 and R22 connected in series, a power supply port V2, a ground port G2, and an output port E2. Each of the MR element arrays R21 and R22 includes a plurality of MR elements 50 connected in series. A first end of the MR element array R21 is connected to the power supply port V2. A second end of the MR element array R21 is connected to a first end of the MR element array R22 and the output port E2. A second end of the MR element array R22 is connected to the ground port G2. A power supply voltage of a predetermined magnitude is applied to the power supply port V2. The ground port G2 is grounded. The output port E2 outputs the second detection signal S2.

As shown in FIG. 4, the MR element arrays R11, R12, R21 and R22 are aligned in the Z direction. The layout of the MR element arrays R11, R12, R21 and R22 is not limited to the example shown in FIG. 4, however.

In the first embodiment, the MR elements 50 are spin-valve MR elements each including a magnetization pinned layer, a free layer and a nonmagnetic layer. The MR elements 50 may be TMR elements or GMR elements. Where the MR elements 50 are TMR elements, the nonmagnetic layer is a tunnel barrier layer. Where the MR elements 50 are GMR elements, the nonmagnetic layer is a nonmagnetic conductive layer. In each MR element 50, the magnetization of the free layer varies depending on the magnetic field applied to the free layer. More specifically, the direction and magnitude of the magnetization of the free layer vary depending on the direction and magnitude of the magnetic field applied to the free layer. Each MR element 50 varies in resistance depending on the direction and magnitude of the magnetization of the free layer. For example, if the free layer has a magnetization of a constant magnitude, the resistance of the MR element reaches the minimum value when the magnetization direction of the free layer is the same as that of the magnetization pinned layer, and reaches the maximum value when the magnetization direction of the free layer is opposite to that of the magnetization pinned layer. In FIG. 4, the arrow drawn within each MR element 50 indicates the magnetization direction of the magnetization pinned layer of the MR element 50.

In the first detection circuit 10, the magnetization pinned layers of the plurality of MR elements 50 included in the MR element array R11 are magnetized in the X direction, and the magnetization pinned layers of the plurality of MR elements 50 included in the MR element array R12 are magnetized in the −X direction. In this case, the potential at the output port E1 varies depending on the strength of a component of the first magnetic field MF1 in a direction parallel to the X and −X directions. The first detection circuit 10 thus detects the strength of the component of the first magnetic field MF1 in the direction parallel to the X and −X directions and outputs the first detection signal S1 indicative of the strength.

In the second detection circuit 20, the magnetization pinned layers of the plurality of MR elements 50 included in the MR element array R21 are magnetized in the −X direction, and the magnetization pinned layers of the plurality of MR elements 50 included in the MR element array R22 are magnetized in the X direction. In this case, the potential at the output port E2 varies depending on the strength of a component of the second magnetic field MF2 in the direction parallel to the X and −X directions. The second detection circuit 20 thus detects the strength of the component of the second magnetic field MF2 in the direction parallel to the X and −X directions and outputs the second detection signal S2 indicative of the strength.

The MR element arrays R11 and R21 are opposite to each other in the magnetization direction of the magnetization pinned layers of the plurality of MR elements 50 included therein. The MR element arrays R12 and R22 are opposite to each other in the magnetization direction of the magnetization pinned layers of the plurality of MR elements 50 included therein. Consequently, the second detection signal S2 has a phase difference of 180° with respect to the first detection signal S1.

In consideration of the production accuracy of the MR elements 50 and other factors, the magnetization pinned layers of the plurality of MR elements 50 in the detection circuits 10 and 20 may be magnetized in directions that are slightly different from the above-described directions.

Each of the MR element arrays R11, R12, R21 and R22 further includes a plurality of lower electrodes and a plurality of upper electrodes, not illustrated, for electrically connecting the plurality of MR elements 50. In each of the MR element arrays R11, R12, R21 and R22, the plurality of lower electrodes are arranged with spacing between every adjacent ones on a substrate (not illustrated) so as to be in a meandering configuration as a whole. Each lower electrode is shaped to be elongated in one direction. On the top surface of each lower electrode, two MR elements 50 are disposed near opposite ends in the longitudinal direction. The plurality of upper electrodes are disposed on the plurality of MR elements 50. Each upper electrode is shaped to be elongated in one direction, and electrically connects two adjacent MR elements 50 that are disposed on two lower electrodes adjacent to each other in the longitudinal direction of the lower electrodes. By such a configuration, the plurality of MR elements 50 in each of the MR element arrays R11, R12, R21 and R22 are connected in series via the plurality of lower and upper electrodes.

Figure 5:
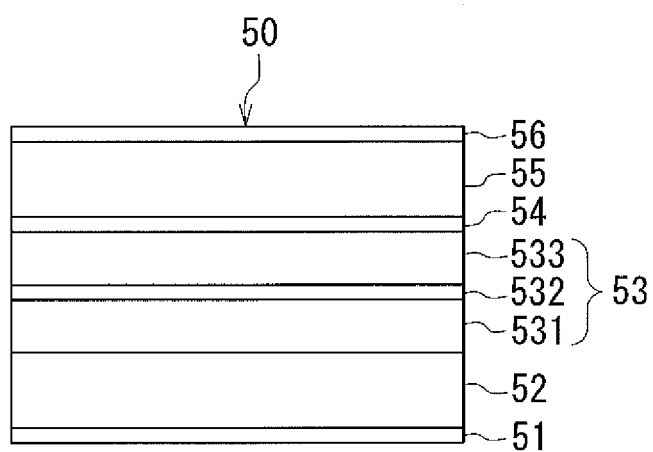
FIG. 5 is a side view of an MR element shown in FIG. 4.

An example of the configuration of each MR element 50 will now be described with reference to FIG. 5. FIG. 5 shows an MR element 50 of FIG. 4. The MR element 50 shown in FIG. 5 includes an underlayer 51, an antiferromagnetic layer 52, a magnetization pinned layer 53, a nonmagnetic layer 54, a free layer 55, and a protective layer 56 stacked in this order, the underlayer 51 being closest to the lower electrode. The underlayer 51 and the protective layer 56 are conductive. The underlayer 51 is provided for eliminating the effects of the crystal axis of the substrate (not illustrated) and to improve the crystallinity and orientability of each layer formed on the underlayer 51. The underlayer 51 may be formed of Ta or Ru, for example. The antiferromagnetic layer 52 is to pin the magnetization direction of the magnetization pinned layer 53 by means of exchange coupling with the magnetization pinned layer 53. The antiferromagnetic layer 52 is formed of an antiferromagnetic material such as IrMn or PtMn.

The magnetization direction of the magnetization pinned layer 53 is pinned by exchange coupling between the antiferromagnetic layer 52 and the magnetization pinned layer 53 at the interface therebetween. In the example shown in FIG. 5, the magnetization pinned layer 53 includes an outer layer 531, a nonmagnetic intermediate layer 532 and an inner layer 533 stacked in this order on the antiferromagnetic layer 52, and is thus formed as a so-called synthetic pinned layer. The outer layer 531 and the inner layer 533 are each formed of a soft magnetic material such as CoFe, CoFeB or CoNiFe. The magnetization direction of the outer layer 531 is pinned by exchange coupling between the outer layer 531 and the antiferromagnetic layer 52. The outer layer 531 and the inner layer 533 are antiferromagnetically coupled to each other, and their magnetizations are thus pinned in mutually opposite directions. The nonmagnetic intermediate layer 532 induces antiferromagnetic exchange coupling between the outer layer 531 and the inner layer 533 so as to pin the magnetizations of the outer layer 531 and the inner layer 533 in mutually opposite directions. The nonmagnetic intermediate layer 532 is formed of a nonmagnetic material such as Ru. Where the magnetization pinned layer 53 includes the outer layer 531, the nonmagnetic intermediate layer 532 and the inner layer 533, the magnetization direction of the magnetization pinned layer 53 refers to that of the inner layer 533.

Where the MR element 50 is a TMR element, the nonmagnetic layer 54 is a tunnel barrier layer. The tunnel barrier layer may be formed by oxidizing a part or the whole of a magnesium layer. Where the MR element 50 is a GMR element, the nonmagnetic layer 54 is a nonmagnetic conductive layer. The free layer 55 is formed of, for example, a soft magnetic material such as CoFe, CoFeB, NiFe, or CoNiFe. The protective layer 56 is provided for protecting the layers located thereunder. The protective layer 56 may be formed of Ta, Ru, W, or Ti, for example.

The underlayer 51 is connected to the lower electrode, and the protective layer 56 is connected to the upper electrode. The MR element 50 is configured to be supplied with a current through the lower electrode and the upper electrode. The current is passed in a direction intersecting the plane of the layers constituting the MR element 50, such as the direction perpendicular to the plane of the layers constituting the MR element 50.

Figure 6:
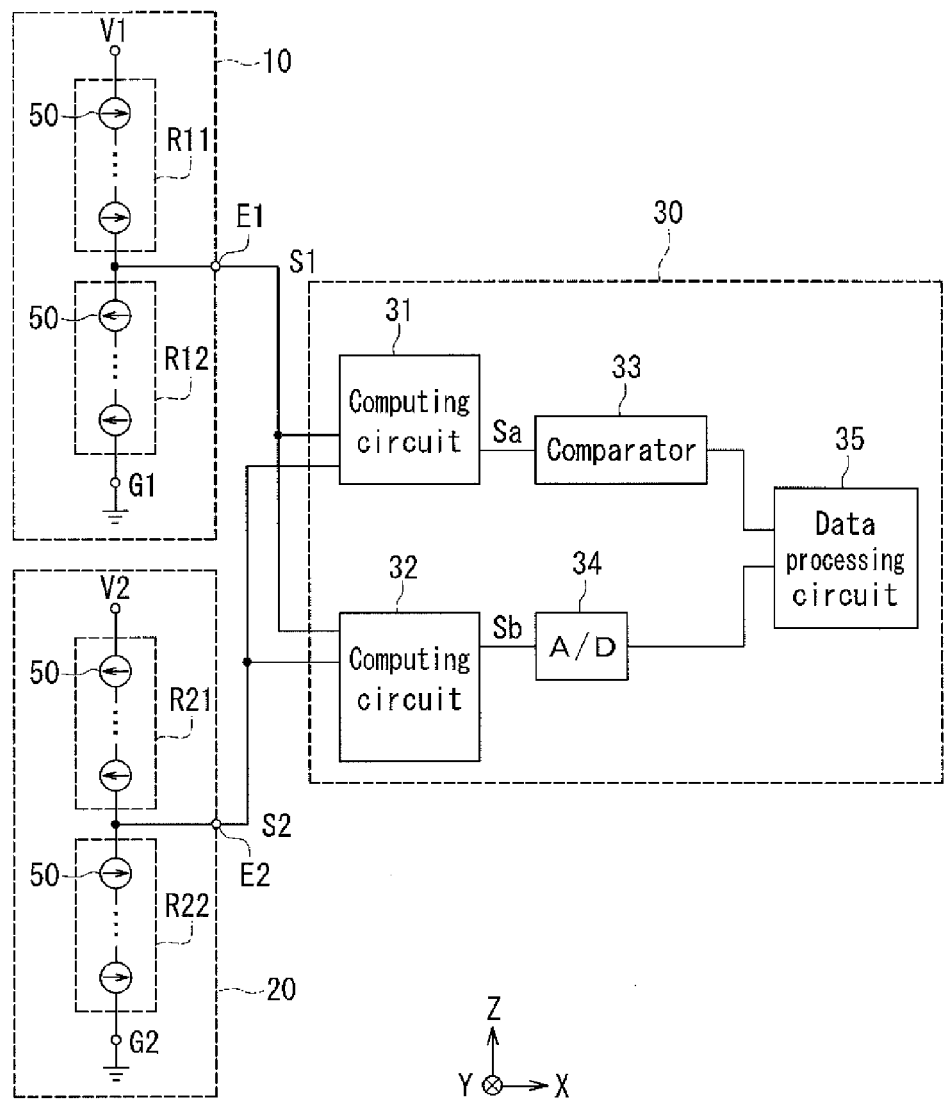
FIG. 6 is a circuit diagram illustrating a first example of the circuit configuration of the magnetic sensor system according to the first embodiment of the invention.
Figure 7:
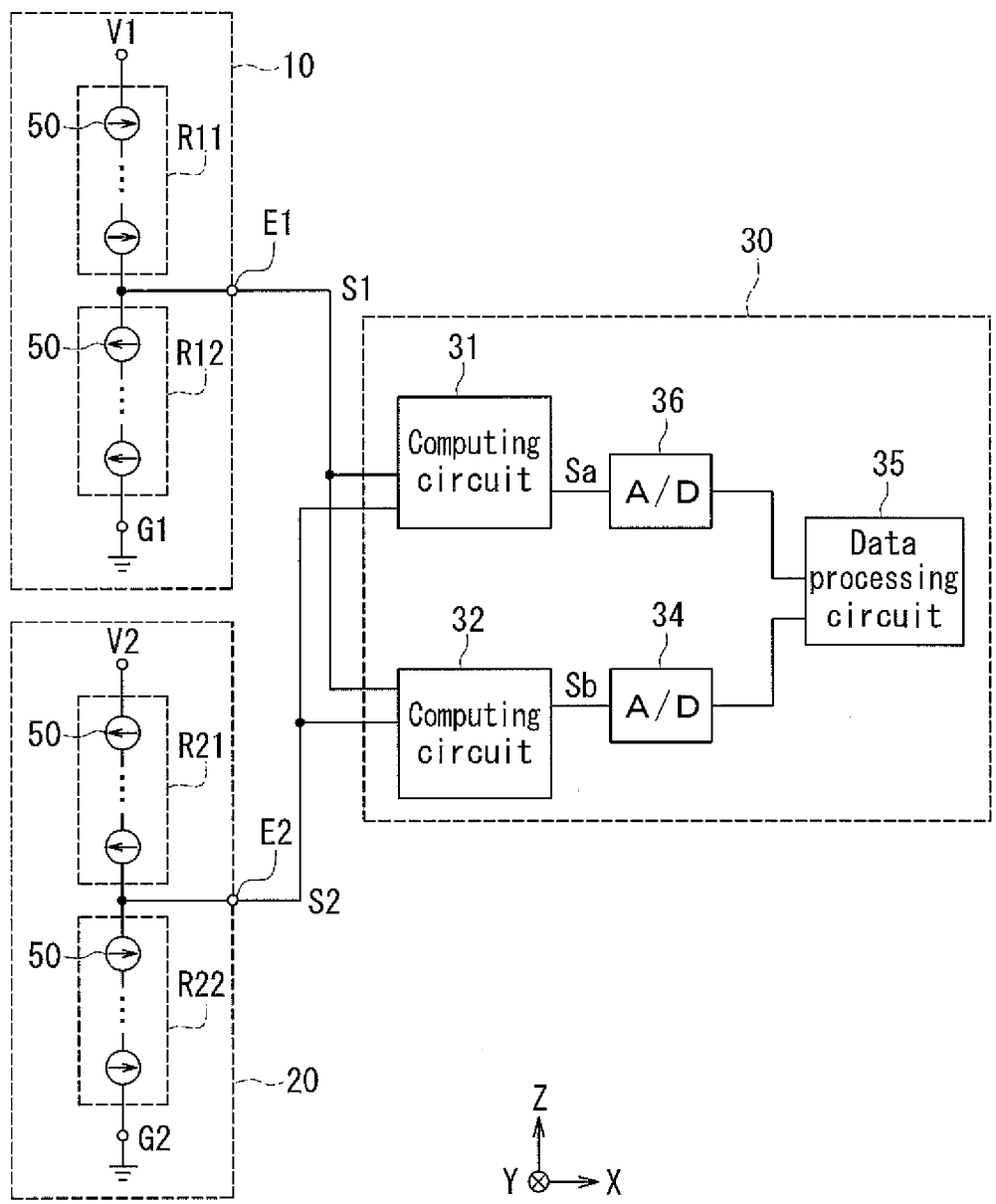
FIG. 7 is a circuit diagram illustrating a second example of the circuit configuration of the magnetic sensor system according to the first embodiment of the invention.

Reference is now made to FIG. 6 and FIG. 7 to describe the circuit configuration of the magnetic sensor system according to the first embodiment, and the computing unit 30. FIG. 6 is a circuit diagram illustrating a first example of the circuit configuration of the magnetic sensor system according to the first embodiment. FIG. 7 is a circuit diagram illustrating a second example of the circuit configuration of the magnetic sensor system according to the first embodiment.

In the first example shown in FIG. 6, the computing unit 30 includes two computing circuits 31 and 32, a window comparator (hereinafter simply referred to as comparator) 33, an analog-to-digital converter (hereinafter referred to as A/D converter) 34, and a data processing circuit 35. The computing circuit 31 has two inputs and an output. The two inputs of the computing circuit 31 are respectively connected to the output port E1 of the first detection circuit 10 and the output port E2 of the second detection circuit 20. The computing circuit 31 generates an abnormal-event determination signal Sa indicative of the presence of an abnormal event in the magnetic sensor 2 by computation using the first and second detection signals S1 and S2. The computation for generating the abnormal-event determination signal Sa may include determining the sum of the first detection signal S1 and the second detection signal S2.

The computing circuit 32 has two inputs and an output. The two inputs of the computing circuit 32 are respectively connected to the output port E1 of the first detection circuit 10 and the output port E2 of the second detection circuit 20. The computing circuit 32 generates, by computation using the first and second detection signals S1 and S2, a third detection signal Sb having a correspondence with the relative positional relationship between the scale 1 and the magnetic sensor 2.

The comparator 33 has an input and an output. The input of the comparator 33 is connected to the output of the computing circuit 31. The comparator 33 outputs a signal indicative of whether the abnormal-event determination signal Sa falls within a predetermined range. If the abnormal-event determination signal Sa falls within the predetermined range, then it is determined that the magnetic sensor 2 is normal. If the abnormal-event determination signal Sa falls outside the predetermined range, then it is determined that the magnetic sensor 2 has an abnormal event.

The A/D converter 34 has an input and an output. The input of the A/D converter 34 is connected to the output of the computing circuit 32. The A/D converter 34 converts the third detection signal Sb into a digital signal and outputs the digital signal.

The data processing circuit 35 has two inputs. The two inputs of the data processing circuit 35 are respectively connected to the output of the comparator 33 and the output of the A/D converter 34. The data processing circuit 35 notifies an abnormal event in the magnetic sensor 2 on the basis of the output signal from the comparator 33, and determines, by computation using the third detection signal Sb, the amount and/or speed of a change in the relative positional relationship between the scale 1 and the magnetic sensor 2, that is, the rotational position and/or the rotational speed of the rotating body or the magnet 5. The data processing circuit 35 can be implemented by a microcomputer, for example.

In the second example shown in FIG. 7, the computing unit 30 includes an A/D converter 36 in place of the comparator 33. The A/D converter 36 has an input and an output. The input of the A/D converter 36 is connected to the output of the computing circuit 31. The output of the A/D converter 36 is connected to one of the two inputs of the data processing circuit 35. The A/D converter 36 convers the abnormal-event determination signal Sa into a digital signal and outputs the digital signal. The data processing circuit 35 determines whether the magnetic sensor 2 has an abnormal event by using the abnormal-event determination signal Sa converted into the digital signal.

Figure 8:
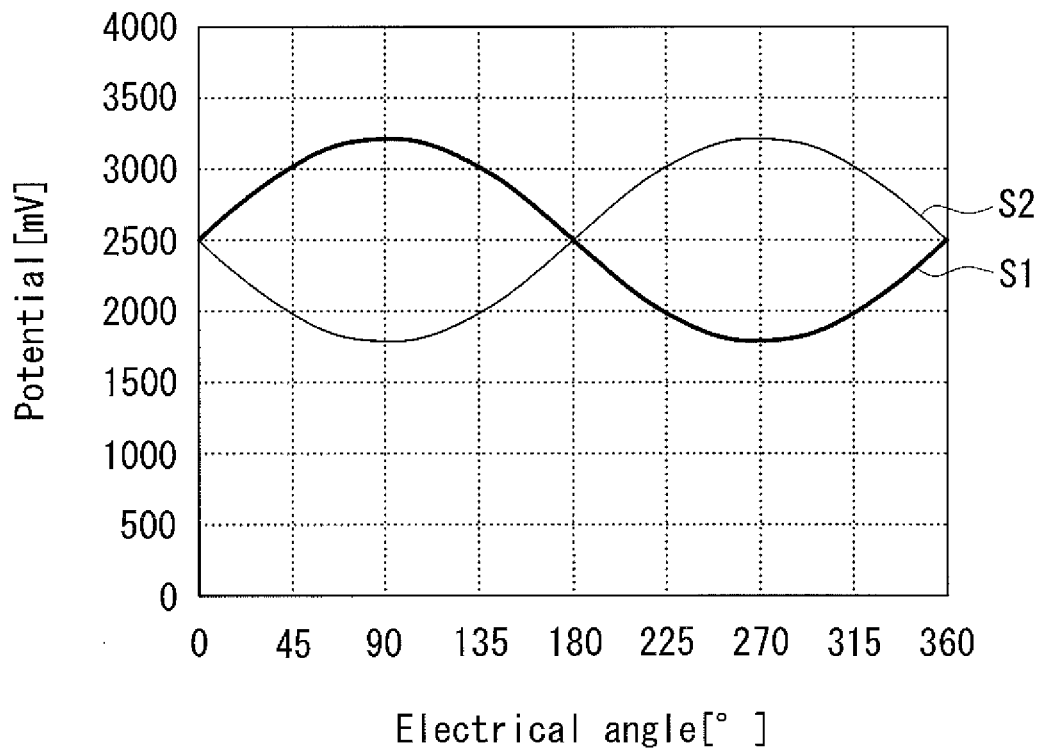
FIG. 8 is a waveform diagram illustrating first and second detection signals of the first embodiment of the invention.

The first to third detection signals S1, S2 and Sb will now be described with reference to FIG. 8. FIG. 8 is a waveform diagram illustrating the first and second detection signals S1 and S2. In FIG. 8, the horizontal axis represents the electrical angle of the first and second detection signals S1 and S2, while the vertical axis represents the potential of the first and second detection signals S1 and S2.

In the first embodiment, as previously mentioned, the second detection signal S2 has a phase difference of 180° with respect to the first detection signal S1. However, in the present invention the phase difference of the second detection signal S2 with respect to the first detection signal S1 is not limited to 180°. As will be described later in relation to other embodiments, the second detection signal S2 may have a phase difference within the range of 175.5° to 184.5° or within the range of −4.5° to 4.5° with respect to the first detection signal S1.

The computing circuit 32 generates, as the third detection signal Sb, the difference between the first detection signal S1 and the second detection signal S2, that is, S1 minus S2, plus an offset voltage of a predetermined magnitude. The offset voltage is to make the center level of the third detection signal Sb equal to the center level of the first and second detection signals S1 and S2. In the example shown in FIG. 8, both the first and second detection signals S1 and S2 have a center level of 2500 mV. In this case, the offset voltage is 2500 mV.

In the first embodiment, as described above, the third detection signal Sb is generated by computation including determining the difference between the first detection signal S1 and the second detection signal S2. This makes it possible to generate the third detection signal Sb with reduced noise when noises of the same phase are superimposed on the first detection signal S1 and the second detection signal S2.

Figure 9:
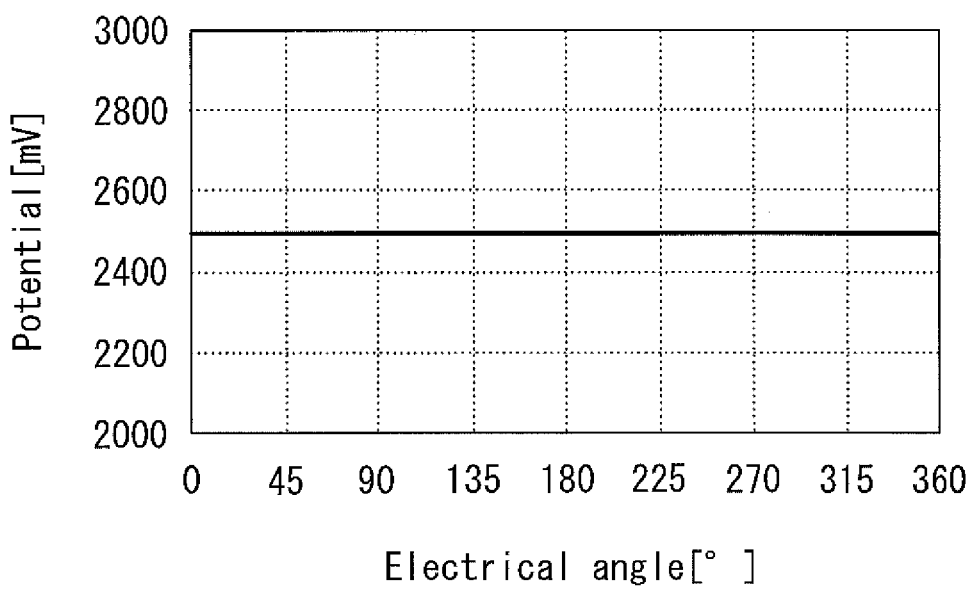
FIG. 9 is a waveform diagram illustrating an abnormal-event determination signal under normal conditions in the first embodiment of the invention.
Figure 10:
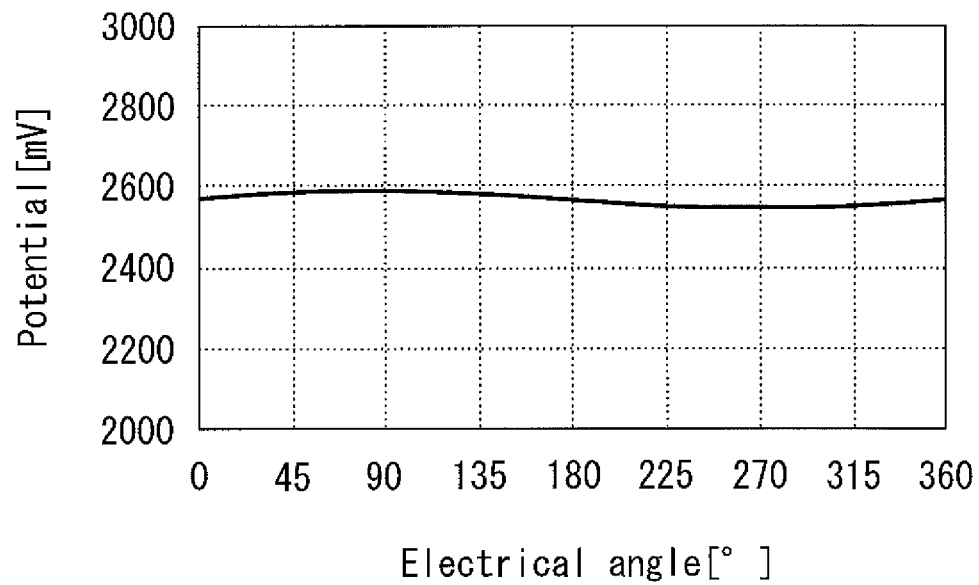
FIG. 10 is a waveform diagram illustrating an example of the abnormal-event determination signal under abnormal conditions in the first embodiment of the invention.

Reference is now made to FIG. 9 and FIG. 10 to describe the abnormal-event determination signal Sa and the effects of the magnetic sensor system according to the first embodiment. FIG. 9 is a waveform diagram illustrating the abnormal-event determination signal Sa under normal conditions. FIG. 10 is a waveform diagram illustrating an example of the abnormal-event determination signal Sa under abnormal conditions. In FIG. 9 and FIG. 10, the horizontal axis represents the electrical angle of the first and second detection signals S1 and S2, while the vertical axis represents the potential of the abnormal-event determination signal Sa.

The computing circuit 31 generates, for example, the sum of the first detection signal S1 and the second detection signal S2 divided by 2, as the abnormal-event determination signal Sa. The center level of the abnormal-event determination signal Sa is equal to the center level of the first to third detection signals S1, S2 and Sb.

When the magnetic sensor 2 has no abnormal event, that is, when the magnetic sensor 2 is under normal conditions, the abnormal-event determination signal Sa has a constant value since the phase difference of the second detection signal S2 with respect to the first detection signal S1 is 180°. In the example shown in FIG. 9, the value of the abnormal-event determination signal Sa is 2500 mV.

On the other hand, when an abnormal event occurs in the first or second detection circuit 10 or 20, the first detection signal S1 or the second detection signal S2 becomes different from that under normal conditions. This causes the abnormal-event determination signal Sa not to have a constant value. An abnormal event in the first or second detection circuit 10 or 20 may be mainly caused by a short circuit in an MR element 50 when the MR element 50 is a TMR element or by a break in any one of the MR element arrays R11, R12, R21 and R22. More specifically, the short circuit in an MR element 50 refers to one that occurs between the magnetization pinned layer 53 and the free layer 55 in a TMR element. No matter what the cause is, the resistance value of any one of the MR element arrays R11, R12, R21 and R22 becomes different from that under normal conditions, and consequently the first detection signal S1 or the second detection signal S2 becomes different from that under normal conditions. Now, the abnormal-event determination signal Sa under abnormal conditions will be described specifically by taking, as an example, the case where an abnormal event is caused in the first or second detection circuit 10 or 20 by a short circuit in an MR element 50.

FIG. 10 shows an example in which each of the MR element arrays R11, R12, R21 and R22 shown in FIG. 4 includes twenty MR elements 50, and one of the MR elements 50 in the MR element array R21 is short-circuited to cause an abnormal event in the second detection circuit 20. In this case, as shown in FIG. 10, the value of the abnormal-event determination signal Sa changes periodically in phase with the first detection signal S1, and the center level of the abnormal-event determination signal Sa becomes greater than that under normal conditions shown in FIG. 9. If two or more of the MR elements 50 in the MR element array R21 are short-circuited, the abnormal-event determination signal Sa has a greater amplitude when compared with the example shown in FIG. 10.

If one or more of the MR elements 50 in the MR element array R11 are short-circuited to cause an abnormal event in the first detection circuit 10, the value of the abnormal-event determination signal Sa changes periodically in phase with the second detection signal S2, and the center level of the abnormal-event determination signal Sa becomes greater than that under normal conditions shown in FIG. 9.

If one or more of the MR elements 50 in the MR element array R12 are short-circuited to cause an abnormal event in the first detection circuit 10, the value of the abnormal-event determination signal Sa changes periodically in phase with the second detection signal S2, and the center level of the abnormal-event determination signal Sa becomes smaller than that under normal conditions shown in FIG. 9.

If one or more of the MR elements 50 in the MR element array R22 are short-circuited to cause an abnormal event in the second detection circuit 20, the value of the abnormal-event determination signal Sa changes periodically in phase with the first detection signal S1, and the center level of the abnormal-event determination signal Sa becomes smaller than that under normal conditions shown in FIG. 9.

The first embodiment uses the above-described characteristics of the abnormal-event determination signal Sa to determine the presence of an abnormal event in the first or second detection circuit 10 or 20, thereby allowing for determination of an abnormal event in the magnetic sensor 2. More specifically, it is possible to determine the presence of an abnormal event in the magnetic sensor 2 by, for example, establishing an upper limit and a lower limit for the value of the abnormal-event determination signal Sa within which it can be determined that neither of the first and second detection circuits 10 and 20 has any abnormal event, and monitoring whether the value of the abnormal-event determination signal Sa falls within the range specified by the upper and lower limits. Such a determination is made by the comparator 33 in the first example shown in FIG. 6 and by the data processing circuit 35 in the second example shown in FIG. 7.

Figure 11:
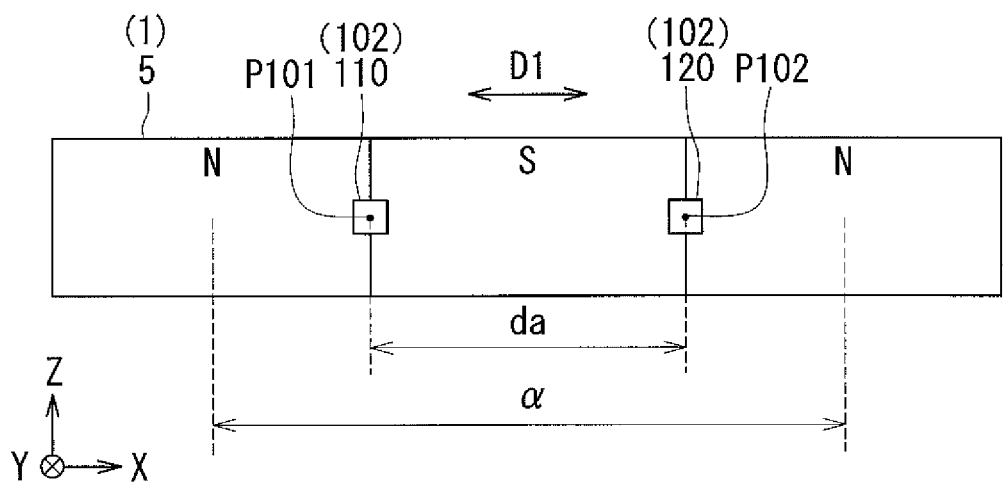
FIG. 11 is a side view illustrating a scale and first and second detection units of a magnetic sensor system of a comparative example.
Figure 12:
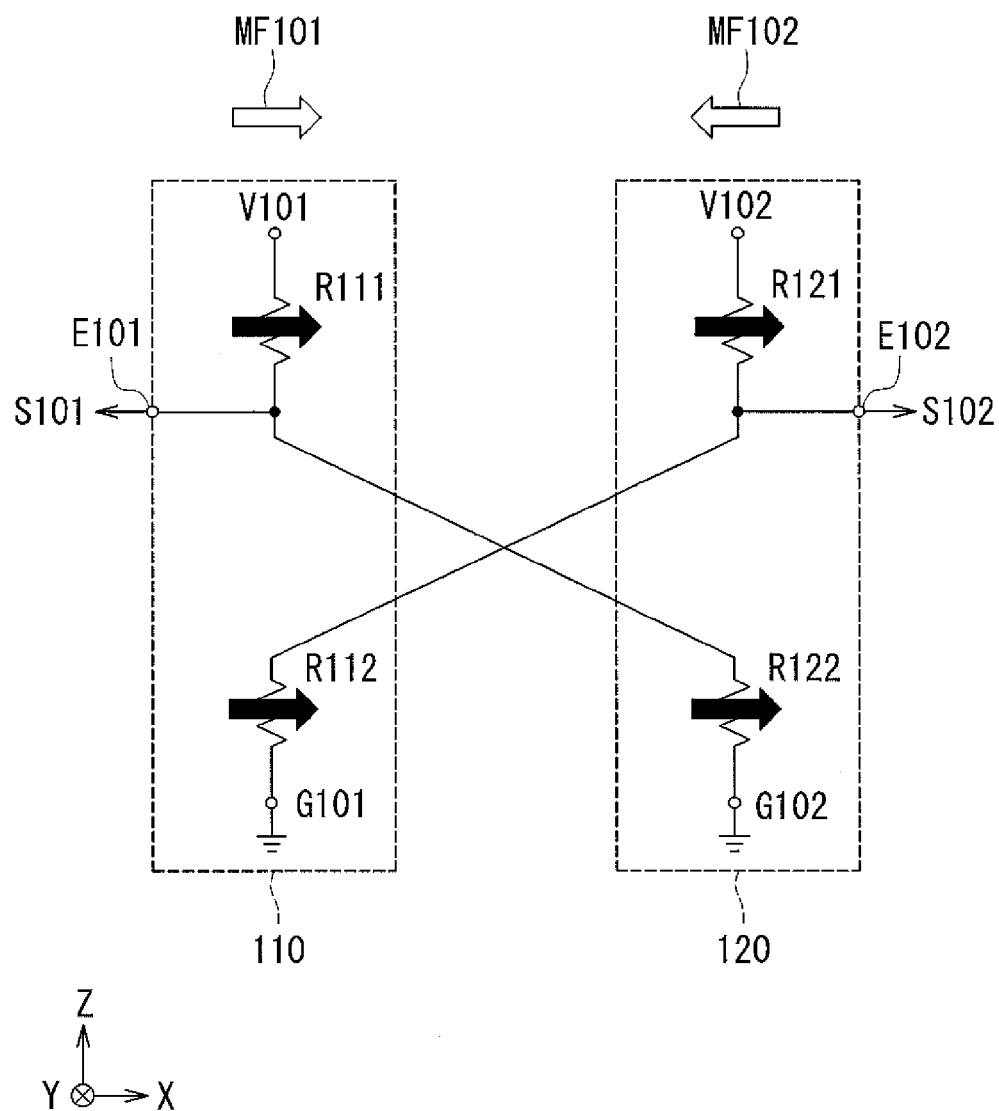
FIG. 12 is a circuit diagram illustrating the first and second detection units of the magnetic sensor system of the comparative example.

The effects of the first embodiment will now be described in more detail in comparison with a magnetic sensor system of a comparative example. First, the configuration of the magnetic sensor system of the comparative example will be described with reference to FIG. 11 and FIG. 12. FIG. 11 is a side view illustrating a scale and first and second detection units of the magnetic sensor system of the comparative example. FIG. 12 is a circuit diagram illustrating the first and second detection units of the magnetic sensor system of the comparative example. FIG. 11 and FIG. 12 illustrate an example in which the magnetic sensor system of the comparative example uses the same scale 1 as that of the first embodiment, that is, the magnet 5.

The magnetic sensor system of the comparative example includes a magnetic sensor 102 in place of the magnetic sensor 2 of the first embodiment. The magnetic sensor 102 is disposed to face the outer circumferential surface of the magnet 5. The magnetic sensor 102 includes a first detection unit 110 disposed at a first position P101 and a second detection unit 120 disposed at a second position P102. In the magnetic sensor system of the comparative example, the first position P101 and the second position P102 are different in the first direction D1. In the example shown in FIG. 11, the first position P101 and the second position P102 are different in the X direction and are the same in the Z direction. Although not illustrated, the first position P101 and the second position P102 are the same in the Y direction. The difference between the first position P101 and the second position P102 in the first direction D1, that is, the positional difference da, is equal to ½ of the angle α representative of one pitch of the magnet 5, that is, equal to ½ pitch of the magnet 5.

A first magnetic field MF101 is applied to the first detection unit 110 and a second magnetic field MF102 is applied to the second detection unit 120. In FIG. 12, the two hollow arrows labeled MF101 and MF102 indicate the directions of the magnetic fields MF101 and MF102, respectively, when in the state shown in FIG. 11. As shown in FIG. 12, the direction of the first magnetic field MF101 and the direction of the second magnetic field MF102 are opposite to each other.

Each of the first detection unit 110 and the second detection unit 120 includes a plurality of MR elements 50. The MR elements 50 are configured in the same manner as those of the magnetic sensor system according to the first embodiment. The first detection unit 110 is disposed such that the plane of the layers constituting each MR element 50 is perpendicular to a straight line connecting the first position P101 and the central axis C (see FIG. 1 and FIG. 2). Likewise, the second detection unit 120 is disposed such that the plane of the layers constituting each MR element 50 is perpendicular to a straight line connecting the second position P102 and the central axis C.

The first detection unit 110 includes MR element arrays R111 and R112, a power supply port V101, a ground port G101, and an output port E101. The second detection unit 120 includes MR element arrays R121 and R122, a power supply port V102, a ground port G102, and an output port E102. A first end of the MR element array 11111 is connected to the power supply port V101. A second end of the MR element array R111 is connected to a first end of the MR element array R122 and the output port E101. A second end of the MR element array 11122 is connected to the ground port G102. A power supply voltage of a predetermined magnitude is applied to the power supply port V101. The ground port G102 is grounded.

A first end of the MR element array 11121 is connected to the power supply port V102. A second end of the MR element array R121 is connected to a first end of the MR element array R112 and the output port E102. A second end of the MR element array 11112 is connected to the ground port G101. A power supply voltage of a predetermined magnitude is applied to the power supply port V102. The ground port G101 is grounded.

Each of the MR element arrays R111, 11112, R121 and R122 includes a plurality of MR elements 50 connected in series. In FIG. 12, the solid arrows indicate the magnetization direction of the magnetization pinned layers 53 of the MR elements 50. As shown in FIG. 12, the magnetization pinned layers 53 of the MR elements 50 in all the MR element arrays R111, R112, R121 and R122 are magnetized in the X direction.

The output port E101 outputs a first detection signal S101 and the output port E102 outputs a second detection signal S102. The layout of the scale 1 and the detection units 110 and 120 shown in FIG. 11 makes the second detection signal S102 have a phase difference of 180° with respect to the first detection signal S101.

The magnetic sensor system of the comparative example includes the same computing unit 30 as that of the magnetic sensor system according to the first embodiment. The computing unit 30 generates a third detection signal by computation using the first and second detection signals 8101 and S102. Specifically, the computing unit 30 generates, as the third detection signal, the difference between the first detection signal S101 and the second detection signal S102, that is, S101 minus S102, plus an offset voltage of a predetermined magnitude. This third detection signal corresponds to the third detection signal Sb of the magnetic sensor system according to the first embodiment.

Figure 13:
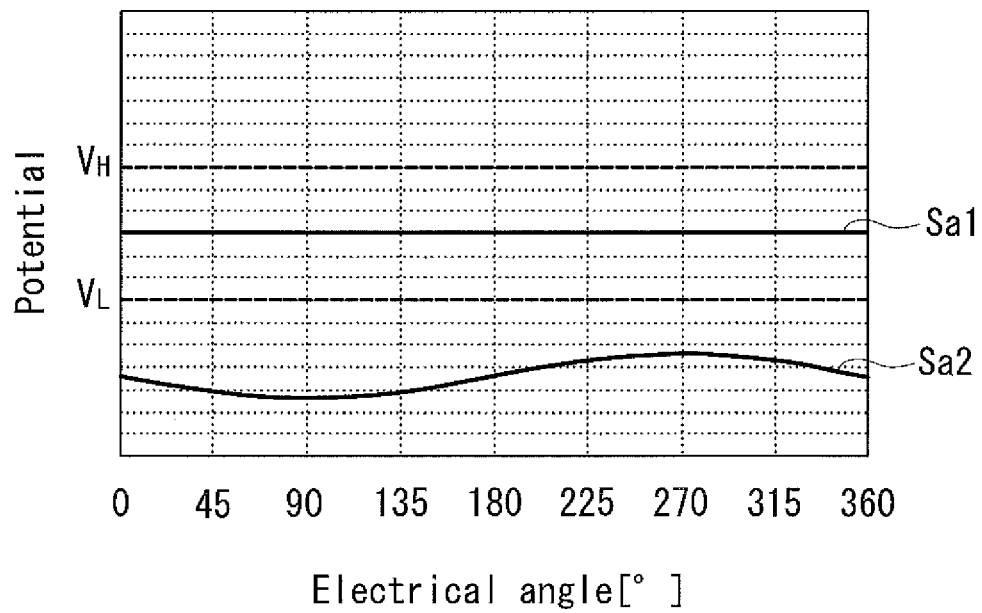
FIG. 13 is a waveform diagram illustrating an example of an abnormal-event determination signal under normal conditions and that under abnormal conditions of the magnetic sensor system of the comparative example.

The abnormal-event determination signal of the magnetic sensor system of the comparative example will now be described with reference to FIG. 13. FIG. 13 is a waveform diagram illustrating the abnormal-event determination signal under normal conditions and that under abnormal conditions of the magnetic sensor system of the comparative example. In FIG. 13, the horizontal axis represents the electrical angle of the first and second detection signals S101 and S102, while the vertical axis represents the potential of the abnormal-event determination signal. Further, in FIG. 13, the reference symbol Sa1 denotes the abnormal-event determination signal under normal conditions while the reference symbol Sat denotes the abnormal-event determination signal under abnormal conditions. Further, the reference symbols $V_H$ and $V_L$ denote the upper limit and the lower limit, respectively, for the value of the abnormal-event determination signal within which it can be determined that neither of the first and second detection units 110 and 120 has any abnormal event. FIG. 13 shows an example for the case where each of the MR element arrays R111, R112, R121 and R122 shown in FIG. 12 includes twenty MR elements 50, and one of the MR elements 50 in the MR element array R112 or R122 is short-circuited to cause an abnormal event in the magnetic sensor 102.

In the magnetic sensor system of the comparative example, the computing unit 30 generates the abnormal-event determination signal by computation using the first and second detection signals S101 and S102. More specifically, the computing unit 30 generates the sum of the first detection signal S101 and the second detection signal S102 divided by 2, as the abnormal-event determination signal. When there is no abnormal event in the magnetic sensor 102, the second detection signal S102 has a phase difference of 180° with respect to the first detection signal S101, and therefore the abnormal-event determination signal Sa1 has a constant value as does the abnormal-even determination signal Sa of the magnetic sensor system according to the first embodiment, thus falling within the range specified by the upper limit $V_H$ and the lower limit $V_L$.

When an abnormal event occurs in the magnetic sensor 102, the abnormal-event determination signal Sa2 falls outside the range specified by the upper limit $V_H$ and the lower limit $V_L$. In the example shown in FIG. 13, the value of the abnormal-event determination signal Sa2 is smaller than the lower limit $V_L$. If one of the MR elements 50 in the MR array R111 or R121 is short-circuited to cause an abnormal event in the magnetic sensor 102, the value of the abnormal-event determination signal Sat becomes greater than the upper limit $V_H$, conversely to the example shown in FIG. 13. Thus, monitoring whether the value of the abnormal-event determination signal falls within the range specified by the upper limit $V_H$ and the lower limit $V_L$ allows for determination of the presence of an abnormal event in the magnetic sensor 102.

Figure 14:
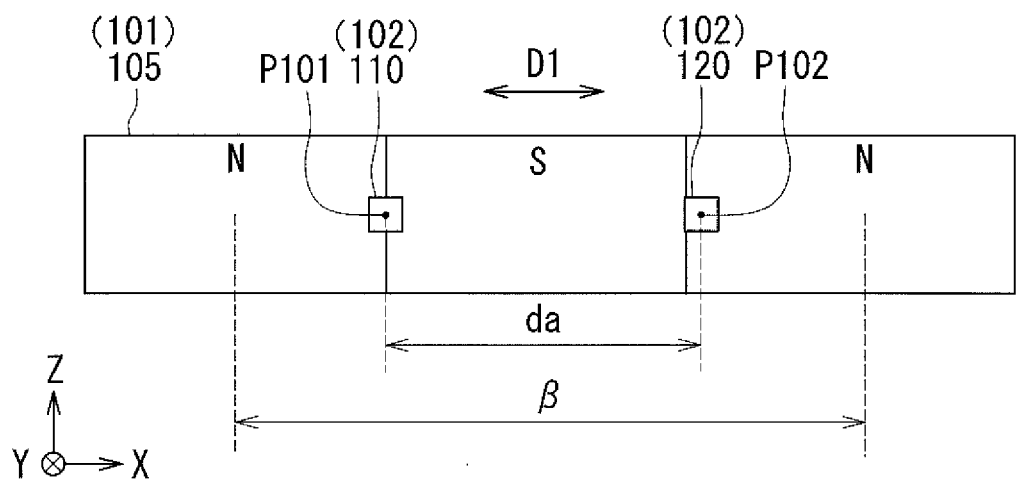
FIG. 14 is a side view illustrating a substitute scale and the first and second detection units of the magnetic sensor system of the comparative example.

Now, a description will be made as to a problem with the magnetic sensor system of the comparative example that may arise when a change in the magnitude of one pitch is caused by changing the scale without changing the configuration of the first and second detection units 110 and 120. Here, assume that the scale 1 is changed to a scale 101. FIG. 14 is a side view illustrating the scale 101 and the first and second detection units 110 and 120. The scale 101 is a multipole-magnetized magnet 105 having a plurality of pairs of N and S poles alternately arranged in a circumferential direction, like the magnet 5. One pitch of the magnet 105 is expressed in an angle β smaller than the angle α for the case of the magnet 5.

The first and second detection units 110 and 120 are disposed at positions the same as those shown in FIG. 11. Consequently, the positional difference da, i.e., the difference between the first position P101 and the second position P102 in the first direction D1, is greater than ½ of one pitch β of the magnet 105. In FIG. 11, the positional difference da is equivalent to an electrical angle of 180° of the first and second detection signals S101 and S102. In FIG. 14, the positional difference da is equivalent to an electrical angle of 188° of the first and second detection signals S101 and S102.

Figure 15:
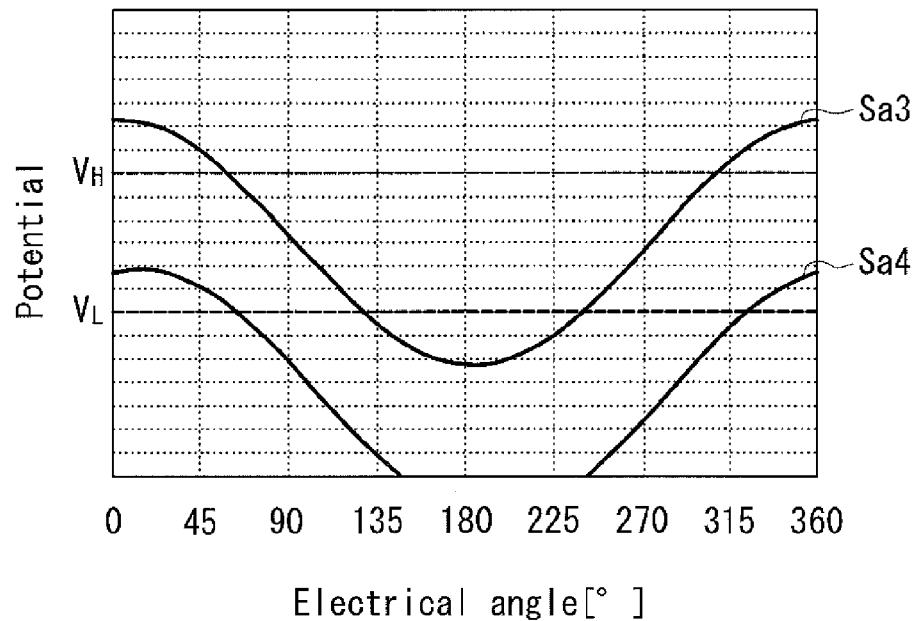
FIG. 15 is a waveform diagram illustrating an example of the abnormal-event determination signal under normal conditions and that under abnormal conditions when the substitute scale is used in the magnetic sensor system of the comparative example.

Reference is now made to FIG. 15 to describe the abnormal-event determination signal resulting from the use of the scale 101 in the magnetic sensor system of the comparative example. FIG. 15 is a waveform diagram illustrating the abnormal-event determination signal under normal conditions and that under abnormal conditions when the scale 101 is used in the magnetic sensor system of the comparative example. In FIG. 15, the horizontal axis represents the electrical angle of the first and second detection signals S101 and S102, while the vertical axis represents the potential of the abnormal-event determination signal. Further, in FIG. 15, the reference symbol Sa3 denotes the waveform of the abnormal-event determination signal under normal conditions when the scale 101 is used, and the reference symbol Sa4 denotes the waveform of the abnormal-event determination signal under abnormal conditions when the scale 101 is used. The upper limit $V_H$ and the lower limit $V_L$ shown in FIG. 13 are also shown in FIG. 15.

As shown in FIG. 15, the value of the abnormal-event determination signal Sa3 under normal conditions is not constant when the scale 101 is used. In the example shown in FIG. 15, the value of the abnormal-event determination signal Sa3 under normal conditions falls outside the range specified by the upper limit $V_H$ and the lower limit $V_L$, and the minimum value of the abnormal-event determination signal Sa3 under normal conditions is smaller than the maximum value of the abnormal-event determination signal Sa4 under abnormal conditions. In this case, since the range of the abnormal-event determination signal Sa3 under normal conditions overlaps the range of the abnormal-event determination signal Sa4 under abnormal conditions, it is impossible to determine the presence of an abnormal event in the magnetic sensor 102 from the abnormal-event determination signal.

In the case of the magnetic sensor system of the comparative example, as described above, even if the first and second detection units 110 and 120 are disposed apart from each other by ½ pitch in accordance with a certain scale 1 (magnet 5), changing the scale 1 to another scale 101 (magnet 105) that differs from the scale 1 in the magnitude of one pitch causes the positional difference da to be inconsistent with ½ pitch of the scale 101. This leads to the problem that even when there is no abnormal event in the magnetic sensor 102, the abnormal-event determination signal does not have a constant value and the range of the abnormal-event determination signal under normal conditions overlaps the range of the abnormal-event determination signal under abnormal conditions, so that it becomes impossible to determine the presence of an abnormal event in the magnetic sensor 102. For the magnetic sensor system of the comparative example, a similar problem will obviously occur when the magnitude of one pitch is increased by changing the scale.

In contrast, the first embodiment is configured so that the first position P1 at which the first detection circuit 10 is disposed and the second position P2 at which the second detection circuit 20 is disposed are the same in the first direction D1. Consequently, even if the scale 1 is changed to another scale that differs from the scale 1 in the magnitude of one pitch, the phase difference of the second detection signal S2 with respect to the first detection signal S1 remains the same, so that the abnormal-event determination signal Sa under normal conditions has a constant value. The first embodiment thus makes it possible to determine the presence of an abnormal event in the magnetic sensor 2 from the abnormal-event determination signal Sa regardless of the magnitude of one pitch.

As will be described later in relation to another embodiment, even when the first position P1 and the second position P2 are different in the first direction D1, it is possible to determine the presence of an abnormal event in the magnetic sensor 2 from the abnormal-event determination signal Sa if the positional difference or the difference between the first position P1 and the second position P2 in the first direction D1 is 1.25% of one pitch or less.

[Second Embodiment]

Figure 16:
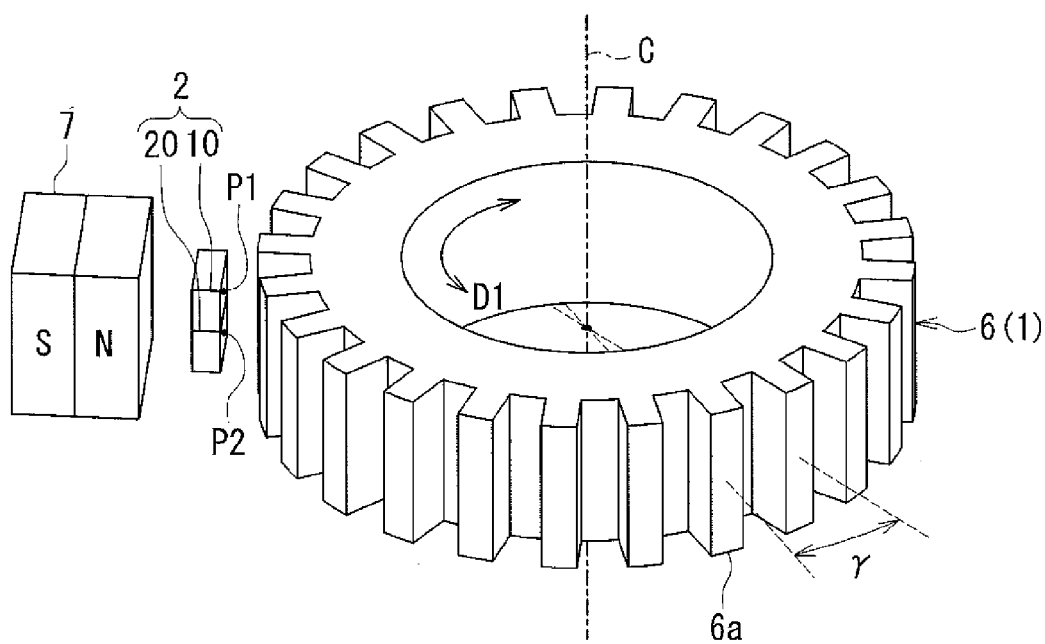
FIG. 16 is a perspective view illustrating the general configuration of a magnetic sensor system according to a second embodiment of the invention.
Figure 17:
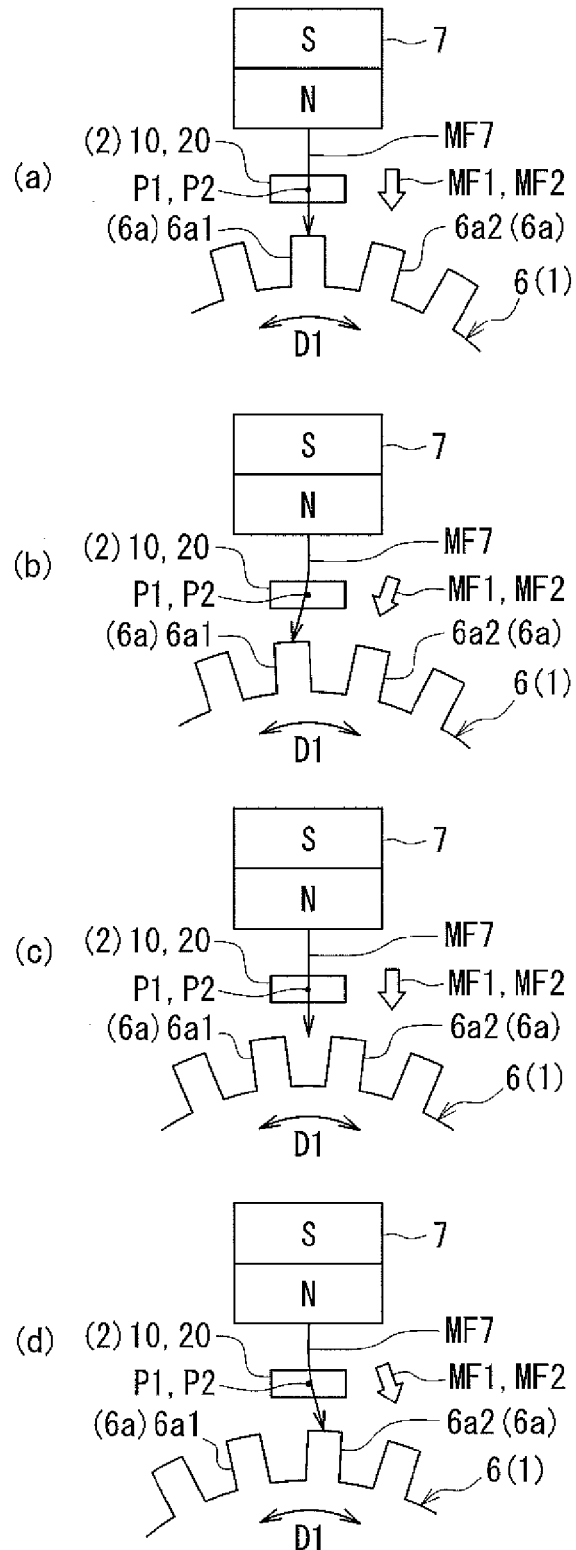
FIG. 17 is an explanatory diagram illustrating the operation of the magnetic sensor system according to the second embodiment of the invention.

A second embodiment of the invention will now be described with reference to FIG. 16 and FIG. 17. FIG. 16 is a perspective view illustrating the general configuration of a magnetic sensor system according to the second embodiment. FIG. 17 is an explanatory diagram illustrating the operation of the magnetic sensor system according to the second embodiment.

The configuration of the magnetic sensor system according to the second embodiment differs from that of the magnetic sensor system according to the first embodiment in the following ways. In the magnetic sensor system according to the second embodiment, the scale 1 is a rotating body that rotates about a predetermined central axis C as with the first embodiment; however, the rotating body of the second embodiment is a gear 6 having teeth 6a formed of a magnetic material. The magnetic sensor 2 is disposed to face the outer circumferential surface of the gear 6.

The magnetic sensor system according to the second embodiment includes a magnet 7 having a fixed positional relationship with the magnetic sensor 2. FIG. 16 shows an example in which the magnet 7 is disposed with the magnetic sensor 2 between the magnet 7 and the gear 6. The N pole of the magnet 7 faces toward the gear 6. In FIG. 17 the arrows labeled MF7 indicate a magnetic flux produced from the magnet 7.

The first detection circuit 10 of the magnetic sensor 2 is disposed at a first position P1 and detects a first magnetic field MF1 applied to the first detection circuit 10. The second detection circuit 20 of the magnetic sensor 2 is disposed at a second position P2 and detects a second magnetic field MF2 applied to the second detection circuit 20. In the second embodiment, each of the first and second magnetic fields MF1 and MF2 is produced by the magnet 7 and changes its direction as the gear 6 rotates. In FIG. 17, the hollow arrows labeled MF1, MF2 indicate the direction of the first and second magnetic fields MF1 and MF2. The direction of the first and second magnetic fields MF1 and MF2 corresponds to the direction of the magnetic flux MF7 when passing through the first and second detection circuits 10 and 20.

As has been described in the first embodiment section, one pitch is the amount of a change in the relative positional relationship between the scale 1 and the magnetic sensor 2 that changes the direction of each of the first magnetic field MF1 and the second magnetic field MF2 by one period. In the second embodiment, one pitch is expressed in an angle in the direction of rotation of the rotating body or the gear 6. Specifically, one pitch is the angle formed by two straight lines that connect the central axis C to the centers of two adjacent teeth 6a of the gear 6. In FIG. 16, the aforementioned two straight lines are shown in broken lines and the angle formed by the two straight lines is denoted by symbol γ. In the example shown in FIG. 16, the angle γ is 15°. In this example, one rotation of the gear 6 causes the direction of each of the first magnetic field MF1 and the second magnetic field MF2 to change by 24 periods. One period of the first and second detection signals S1 and S2, i.e., an electrical angle of 360°, is equivalent to a 1/24 rotation of the gear 6, i.e., a 15-degree angle of rotation of the gear 6.

The first position P1 and the second position P2 are the same in the first direction D1. As has been described in the first embodiment section, it is required that the positional difference, i.e., the difference between the first position P1 and the second position P2 in the first direction D1, be 1.25% of one pitch or less. In the example shown in FIG. 16, since one pitch or the angle γ is 15°, the positional difference needs to be 0.1875° or less. In the second embodiment, since the first position P1 and the second position P2 are the same in the first direction D1, the positional difference is 0° and thus satisfies the aforementioned requirement. In the example shown in FIG. 16, the first position P1 and the second position P2 are different in a direction parallel to the central axis C.

Portions (a), (b), (c) and (d) of FIG. 17 illustrate four relative positional relationships between the scale 1 and the magnetic sensor 2. Portion (a) illustrates a state in which the center of one of the teeth 6a of the gear 6 is located closest to the magnet 7. Portion (b) illustrates a state in which the gear 6 has rotated by 3° in a counterclockwise direction from the state shown in portion (a). Portion (c) illustrates a state in which the gear 6 has rotated by 4.5° in a counterclockwise direction from the state shown in portion (b), that is, the gear 6 has rotated by ½ pitch)(7.5° in a counterclockwise direction from the state shown in portion (a). Portion (d) illustrates a state in which the gear 6 has rotated by 4.5° in a counterclockwise direction from the state shown in portion (c).

Each of the first and second magnetic fields MF1 and MF2 changes its direction in the following manner as the gear 6 rotates. Here, attention is focused on two adjacent teeth Gal and 6a2 of the gear 6. When in the states shown in portions (a) and (b) of FIG. 17, the distance between the tooth Gal and the magnet 7 is smaller than the distance between the tooth 6a2 and the magnet 7. When in the state shown in portion (c) of FIG. 17, the distance between the tooth 6a1 and the magnet 7 is equal to the distance between the tooth 6a2 and the magnet 7. When in the state shown in portion (d) of FIG. 17, the distance between the tooth 6a2 and the magnet 7 is smaller than the distance between the tooth Ga1 and the magnet 7.

First, when in the state shown in portion (a) of FIG. 17, the first and second magnetic fields MF1 and MF2 are oriented in the direction from the first and second positions P1 and P2 to the tooth Ga1, that is, in the downward direction in FIG. 17. Then, when the gear 6 rotates into the state shown in portion (b) of FIG. 17, the first and second magnetic fields MF1 and MF2 are oriented in the direction from the first and second positions P1 and P2 to the tooth Ga1, that is, in the down-leftward direction in FIG. 17. Then, when the gear 6 rotates into the state shown in portion (c) of FIG. 17, the first and second magnetic fields MF1 and MF2 are oriented in the direction from the first and second positions P1 and P2 to the midpoint between the tooth Ga1 and the tooth 6a2, that is, in the downward direction in FIG. 17. Then, when the gear 6 rotates into the state shown in portion (d) of FIG. 17, the first and second magnetic fields MF1 and MF2 are oriented in the direction from the first and second positions P1 and P2 to the tooth 6a2, that is, in the down-rightward direction in FIG. 17.

In such a manner, as the gear 6 rotates, the first and second magnetic fields MF1 and MF2 change direction so as to be oriented from the first and second positions P1 and P2 to the tooth 6a which is at the shortest distance from the magnet 7. In the example shown in FIG. 17, the direction of each of the first and second magnetic fields MF1 and MF2 changes periodically from the downward direction to the down-leftward direction, then to the downward direction, and then to the down-rightward direction in this order.

The first detection circuit 10 detects, for example, the strength of a component of the first magnetic field MF1 in the horizontal direction in FIG. 17 and outputs a first detection signal indicative of the strength. The second detection circuit 20 detects, for example, the strength of a component of the second magnetic field MF2 in the horizontal direction in FIG. 17 and outputs a second detection signal indicative of the strength. The second detection signal has a phase difference of 180° with respect to the first detection signal.

The remainder of configuration, function and effects of the second embodiment are similar to those of the first embodiment.

[Third Embodiment]

Figure 18:
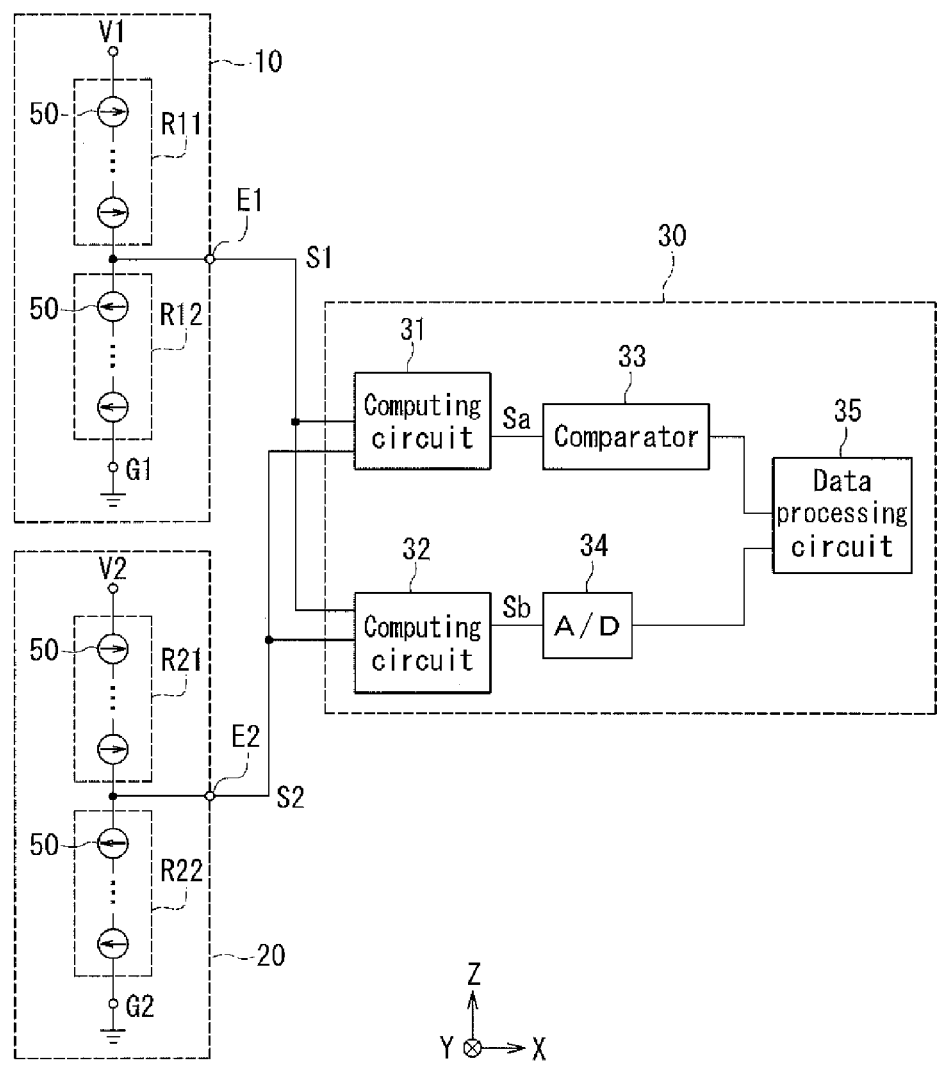
FIG. 18 is a circuit diagram illustrating an example of the circuit configuration of a magnetic sensor system of a third embodiment of the invention.

A third embodiment of the invention will now be described with reference to FIG. 18. FIG. 18 is a circuit diagram illustrating an example of the circuit configuration of a magnetic sensor system according to the third embodiment. In the third embodiment, the magnetization directions of the magnetization pinned layers of the MR elements 50 included in the second detection circuit 20 are opposite to those in the first embodiment. More specifically, as shown in FIG. 18, in the second detection circuit 20 the magnetization pinned layers of the MR elements 50 included in the MR element array R21 are magnetized in the X direction, and the magnetization pinned layers of the MR elements 50 included in the MR element array R22 are magnetized in the −X direction. In the third embodiment, the phase difference of the second detection signal S2 with respect to the first detection signal S1 is 0°.

FIG. 18 shows a computing unit 30 configured in the same manner as the computing unit 30 shown in FIG. 6 described in the first embodiment section. However, the contents of computation by the computing unit 30 in the third embodiment are different from those in the first embodiment. The computing circuit 31 generates the abnormal-event determination signal Sa by computation using the first and second detection signals S1 and S2. In the third embodiment, the computation for generating the abnormal-event determination signal Sa includes determining the difference between the first detection signal S1 and the second detection signal S2. More specifically, the computing circuit 31 generates, for example, the difference between the first detection signal S1 and the second detection signal S2, that is, S1 minus S2, plus an offset voltage of a predetermined magnitude, as the abnormal-event determination signal Sa. Further, the computing circuit 32 generates, for example, the sum of the first detection signal S1 and the second detection signal S2 divided by 2, as the third detection signal Sb.

The rotating body serving as the scale 1 of the third embodiment may be the magnet 5 described in the first embodiment section or the gear 6 described in the second embodiment section. Further, the computing unit 30 of the third embodiment may be configured in the same manner as the computing unit 30 shown in FIG. 7 described in the first embodiment section. The remainder of configuration, function and effects of the third embodiment are similar to those of the first or second embodiment.

[Fourth Embodiment]

Figure 19:
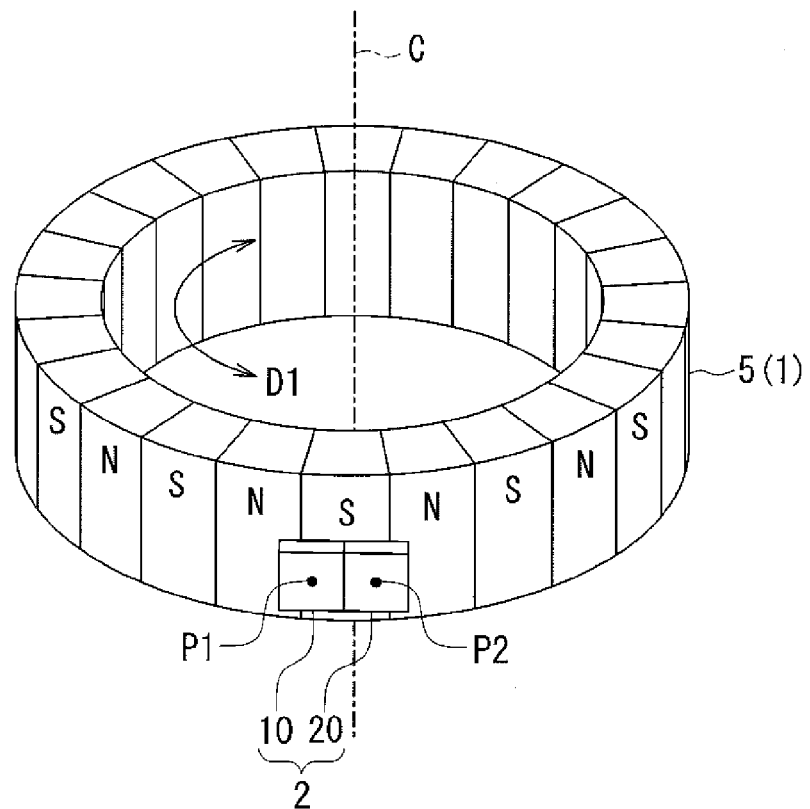
FIG. 19 is a perspective view illustrating the general configuration of a magnetic sensor system according to a fourth embodiment of the invention.
Figure 20:
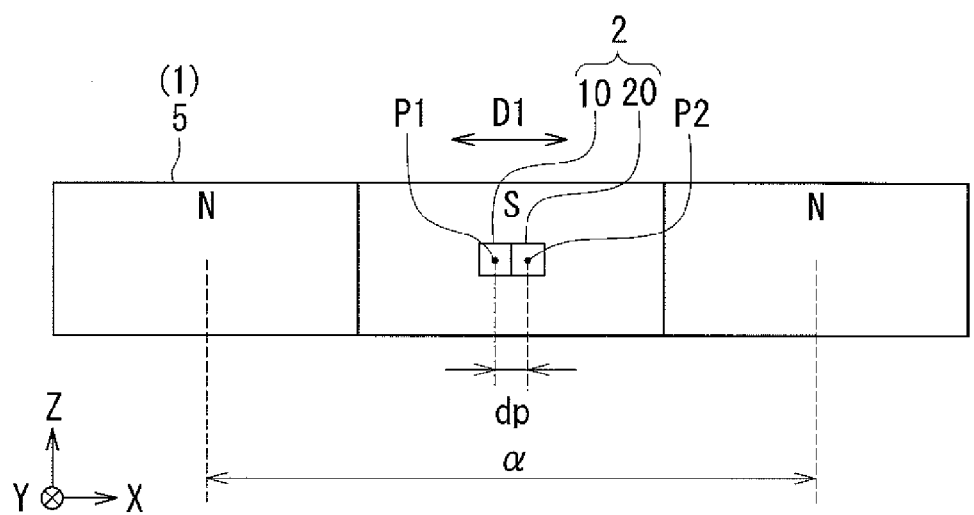
FIG. 20 is a side view illustrating a scale and first and second detection circuits of the fourth embodiment of the invention.

A fourth embodiment of the invention will now be described. First, the configuration of a magnetic sensor system according to the fourth embodiment will be described with reference to FIG. 19 and FIG. 20. FIG. 19 is a perspective view illustrating the general configuration of the magnetic sensor system according to the fourth embodiment. FIG. 20 is a side view illustrating the scale and the first and second detection circuits of the fourth embodiment.

The configuration of the magnetic sensor system according to the fourth embodiment differs from that of the magnetic sensor system according to the first embodiment in the following ways. In the fourth embodiment, as shown in FIG. 19 and FIG. 20, the first position P1 and the second position P2 are different in the first direction D1. Note that in FIG. 19, the distance between the first position P1 and the second position P2 is exaggerated for ease of understanding. In the example shown in FIG. 20, the first position P1 and the second position P2 are different in the X direction and are the same in the Z direction. Although not illustrated, the first position P1 and the second position P2 are the same in the Y direction.

Each of the first detection circuit 10 and the second detection circuit 20 includes the MR elements 50 described in the first embodiment section (see FIG. 5). For example, the first and second detection circuits 10 and 20 are disposed such that the plane of the layers constituting the MR elements 50 included therein is perpendicular to a straight line connecting the central axis C to the midpoint between the first and second positions P1 and P2.

FIG. 20 shows the angle α representative of one pitch of the magnet 5. Here, the positional difference or the difference between the first position P1 and the second position P2 in the first direction D1 is denoted by symbol dp. In the fourth embodiment, the positional difference dp is defined by an angle in the direction of rotation of the rotating body or the magnet 5, the angle being formed by two straight lines that connect the central axis C to the first and second positions P1 and P2. It is required that the positional difference dp be 1.25% of one pitch or less. For example, as with the first embodiment, when the angle α is 30°, the positional difference dp needs to be 0.375° or less.

Since the multipole-magnetized magnet 5 has to be magnetized so that the N and S poles are alternately arranged in a circumferential direction, the distance between the centers of two adjacent N poles on the outer circumferential surface of the magnet 5 needs to be of a certain magnitude. In practice, a sufficient distance between the centers of two adjacent N poles is expected to be 4 mm or greater. Assuming that the distance between the centers of two adjacent N poles is 4 mm, the distance between the first position P1 and the second position P2 needs to be 50 μm or less in the fourth embodiment. As has been described in the first embodiment section, the MR elements 50 included in each of the first and second detection circuits 10 and 20 are spin-valve MR elements. The spin-valve MR elements 50 allow for a significant reduction in footprint when compared with anisotropic magnetoresistive elements. Thus, according to the fourth embodiment, if the distance between the centers of two adjacent N poles or the magnitude of one pitch falls within a practical range, it is possible to dispose the first and second detection circuits 10 and 20 such that the positional difference dp is 1.25% of one pitch or less. Even if the distance between the centers of two adjacent N poles is less than 4 mm, offsetting the first and second detection circuits 10 and 20 from each other in the Z direction as in the first embodiment allows the first and second detection circuits 10 and 20 to be disposed such that the positional difference dp is 1.25% of one pitch or less.

Figure 21:
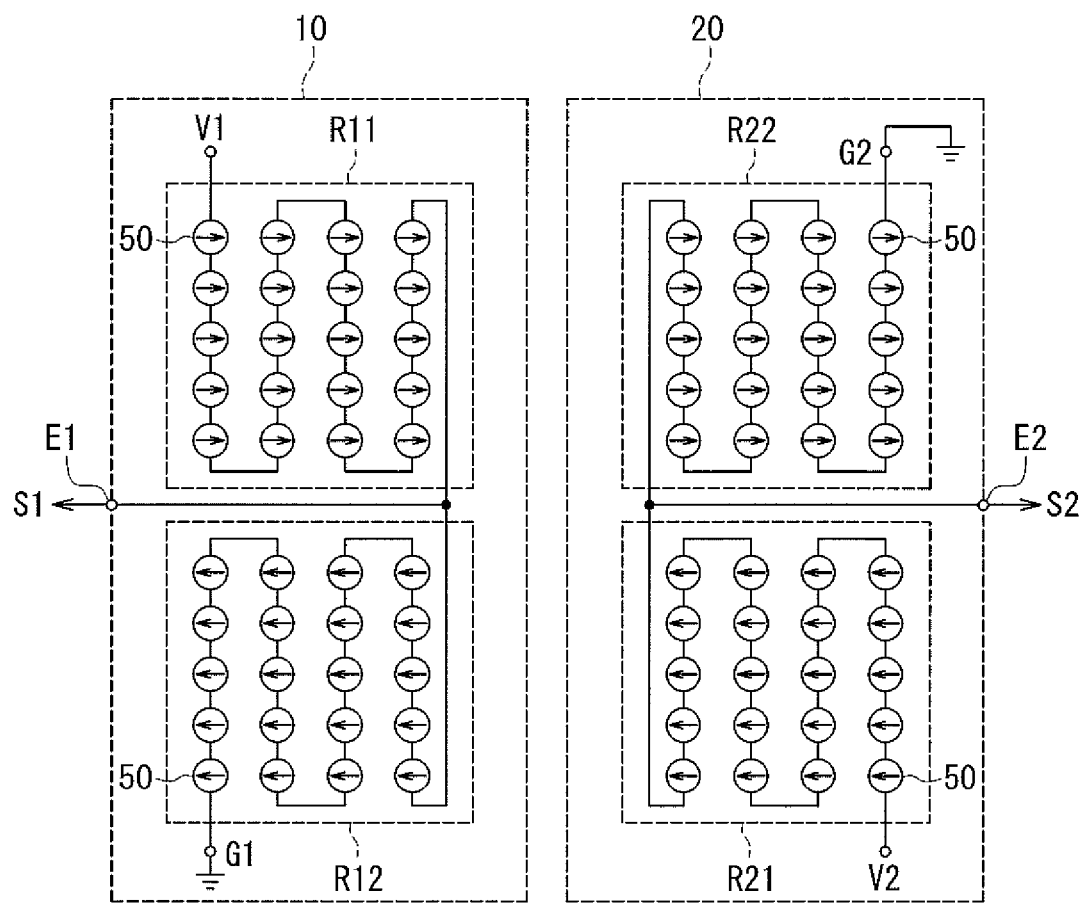
FIG. 21 is a plan view illustrating the first and second detection circuits of the fourth embodiment of the invention.

The configurations of the first and second detection circuits 10 and 20 will now be described with reference to FIG. 21. FIG. 21 is a plan view illustrating the first and second detection circuits 10 and 20. The layout of the first and second detection circuits 10 and 20 in the fourth embodiment is different from that in the first embodiment. As shown in FIG. 21, the first detection circuit 10 and the second detection circuit 20 are disposed to be adjacent in the X direction. The MR element array R11 and the MR element array R12 of the first detection circuit 10 are disposed to be adjacent in the Z direction. The MR element array R21 and the MR element array R22 of the second detection circuit 20 are disposed to be adjacent in the Z direction.

The first detection circuit 10 detects the strength of a component of the first magnetic field MF1 in a direction parallel to the X and −X directions, and outputs a first detection signal S1 indicative of the strength. The second detection circuit 20 detects the strength of a component of the second magnetic field MF2 in the direction parallel to the X and −X directions, and outputs a second detection signal S2 indicative of the strength. In the fourth embodiment, since the first position P1 and the second position P2 are different in the first direction D1, the first magnetic field MF1 and the second magnetic field MF2 are in mutually different directions, so that the phase difference of the second detection signal S2 with respect to the first detection signal S1 is not 180°.

The abnormal-event determination signal Sa in the fourth embodiment will now be described. The abnormal-event determination signal Sa in the fourth embodiment is generated in the same manner as the first embodiment. More specifically, for example, the sum of the first detection signal S1 and the second detection signal S2 divided by 2 is generated as the abnormal-event determination signal Sa in the fourth embodiment. In the fourth embodiment, since the phase difference of the second detection signal S2 with respect to the first detection signal S1 is not 180°, the abnormal-event determination signal Sa does not have a constant value even when neither of the first and second detection circuits 10 and 20 has any abnormal event. However, if the positional difference dp is 1.25% of one pitch or less and the phase difference of the second detection signal S2 with respect to the first detection signal S1 falls within the range of 175.5° to 184.5°, it is possible to determine the presence of an abnormal event in the first or second detection circuit 10 or 20 from the abnormal-event determination signal Sa. This will be described in detail below.

Figure 22:
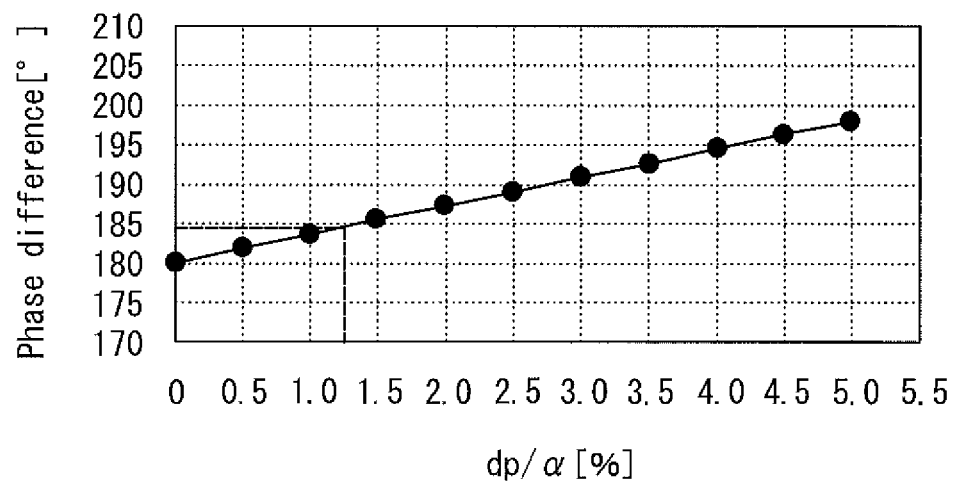
FIG. 22 is a characteristic diagram illustrating the relationship between the difference between the first and second positions and the phase difference of the second detection signal with respect to the first detection signal in the fourth embodiment of the invention.

First, reference is made to FIG. 22 to describe the relationship between the positional difference dp and the phase difference of the second detection signal S2 with respect to the first detection signal S1. FIG. 22 is a characteristic diagram illustrating the relationship between the positional difference dp and the phase difference of the second detection signal S2 with respect to the first detection signal S1. In FIG. 22, the horizontal axis represents dp/α, that is, the positional difference dp divided by the angle α, while the vertical axis represents the phase difference of the second detection signal S2 with respect to the first detection signal S1. In FIG. 22, dp/α is expressed as a percentage. FIG. 22 shows an example for the case where the magnet 5 rotates in the direction from the first position P1 toward the second position P2.

As can be seen from FIG. 22, if the angle α is constant in the example above, the phase difference of the second detection signal S2 with respect to the first detection signal S1 is greater than 180° and the difference between the phase difference and 180° increases with increasing positional difference dp when the positional difference dp is greater than 0. If the magnet 5 rotates in the direction from the second position P2 toward the first position P1, the phase difference of the second detection signal S2 with respect to the first detection signal S1 is smaller than 180° and the difference between the phase difference and 180° increases with increasing positional difference dp when the positional difference dp is greater than 0.

Figure 23:
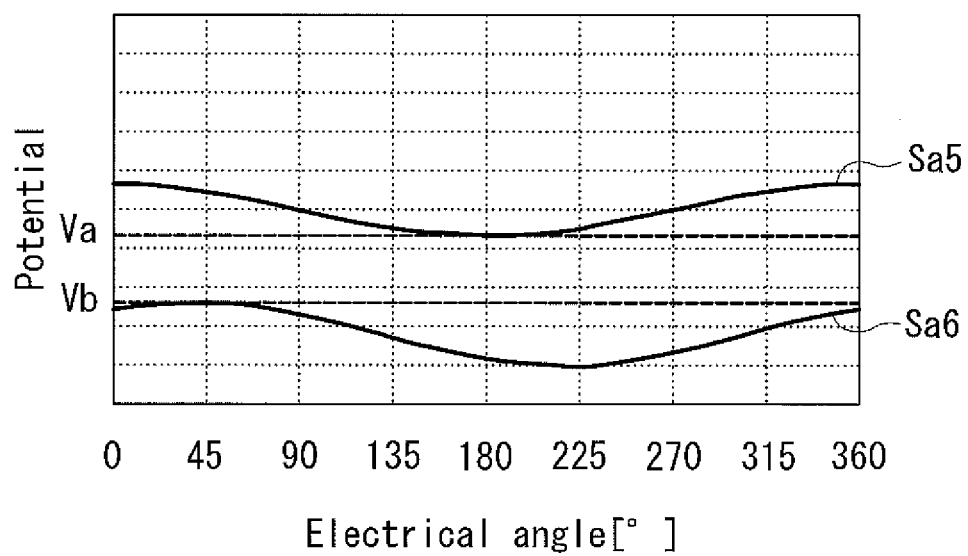
FIG. 23 is a waveform diagram illustrating an example of an abnormal-event determination signal under normal conditions and that under abnormal conditions in the fourth embodiment of the invention.

An example of the abnormal-event determination signal will now be described with reference to FIG. 23. FIG. 23 is a waveform diagram illustrating an example of the abnormal-event determination signal under normal conditions and that under abnormal conditions. In FIG. 23, the horizontal axis represents the electrical angle of the first and second detection signals S1 and S2, while the vertical axis represents the potential of the abnormal-event determination signal. Further, in FIG. 23, the reference symbol Sa5 denotes the abnormal-event determination signal under normal conditions, the reference symbol Sa6 denotes the abnormal-event determination signal under abnormal conditions, the reference symbol Va denotes the minimum value of the abnormal-event determination signal Sa5, and the reference symbol Vb denotes the maximum value of the abnormal-event determination signal Sa6. The abnormal-event determination signal Sa6 under abnormal conditions in FIG. 23 shows an example for the case where each of the MR element arrays R11, R12, R21 and R22 shown in FIG. 21 includes twenty MR elements 50, and one of the MR elements 50 in the MR element array R12 or R22 is short-circuited to cause an abnormal event in the first or second detection circuit 10 or 20.

In the example shown in FIG. 23, the abnormal-event determination signal Sa6 under abnormal conditions is smaller in value than the abnormal-event determination signal Sa5 under normal conditions. Further, the minimum value Va of the abnormal-event determination signal Sa5 under normal conditions is greater than the maximum value Vb of the abnormal-event determination signal Sa6 under abnormal conditions, so that the range of the abnormal-event determination signal Sa5 under normal conditions does not overlap the range of the abnormal-event determination signal Sa6 under abnormal conditions. Although not illustrated, if one of the MR elements 50 in the MR array R11 or R21 is short-circuited to cause an abnormal event in the first or second detection circuit 10 or 20, the abnormal-event determination signal Sa6 under abnormal conditions becomes greater in value than the abnormal-event determination signal Sa5 under normal conditions, conversely to the example shown in FIG. 23. In this case, the minimum value of the abnormal-event determination signal Sa6 under abnormal conditions is greater than the maximum value of the abnormal-event determination signal Sa5 under normal conditions, so that the range of the abnormal-event determination signal Sa5 under normal conditions does not overlap the range of the abnormal-event determination signal Sa6 under abnormal conditions.

When the range of the abnormal-event determination signal Sa5 under normal conditions does not overlap the range of the abnormal-event determination signal Sa6 under abnormal conditions as described above, it is possible to determine the presence of an abnormal event in the magnetic sensor 2 from the abnormal-event determination signal, as with the first embodiment.

Figure 24:
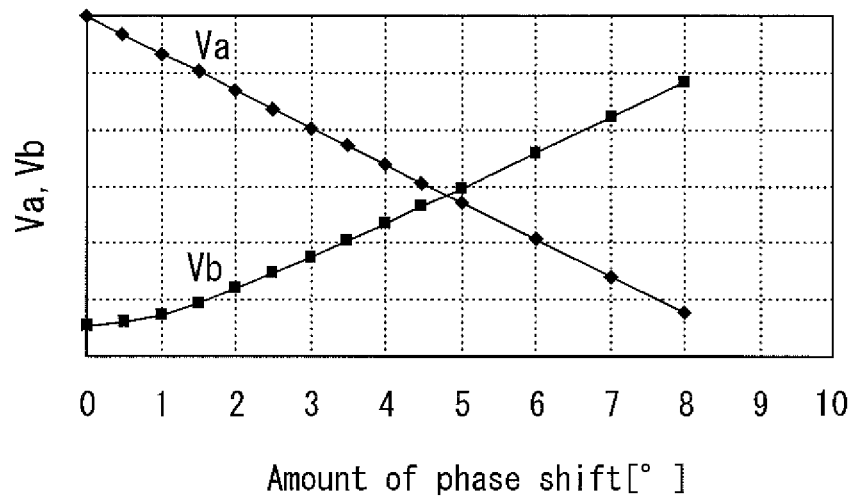
FIG. 24 is a characteristic diagram illustrating the relationship between the minimum value of the abnormal-event determination signal under normal conditions and the maximum value of the abnormal-event determination signal under abnormal conditions in the fourth embodiment of the invention.

Reference is now made to FIG. 22 and FIG. 24 to describe the range of the phase difference of the second detection signal S2 with respect to the first detection signal S1 and the range of the positional difference dp. FIG. 24 illustrates the relationship between the minimum value Va of the abnormal-event determination signal Sa5 under normal conditions and the maximum value Vb of the abnormal-event determination signal Sa6 under abnormal conditions. In FIG. 24, the horizontal axis represents the difference between 180° and the phase difference of the second detection signal S2 with respect to the first detection signal S1, which will hereinafter be referred to as the amount of phase shift, while the vertical axis represents the minimum value Va and the maximum value Vb. The maximum value Vb in FIG. 24 was determined under the same conditions as those in the example shown in FIG. 23 except for the amount of phase shift.

As shown in FIG. 24, as the amount of phase shift increases, the minimum value Va decreases and the maximum value Vb increases. When the minimum value Va becomes equal to or smaller than the maximum value Vb, it becomes impossible to determine the presence of an abnormal event in the magnetic sensor 2 from the abnormal-event determination signal. It is thus required that the amount of phase shift be of a value at which the minimum value Va is greater than the maximum value Vb. For the example shown in FIG. 24, the amount of phase shift needs to be 4.5° or less.

As described previously, if one of the MR elements 50 in the MR element array R11 or R21 is short-circuited to cause an abnormal event in the first or second detection circuit 10 or 20, the abnormal-event determination signal Sa6 under abnormal conditions becomes greater in value than the abnormal-event determination signal Sa5 under normal conditions. In this case, as the amount of phase shift increases, the maximum value of the abnormal-event determination signal Sa5 under normal conditions increases and the minimum value of the abnormal-event determination signal Sa6 under abnormal conditions decreases. In this case also, if the amount of phase shift is 4.5° or less, then the maximum value of the abnormal-event determination signal Sa5 under normal conditions is smaller than the minimum value of the abnormal-event determination signal Sa6 under abnormal conditions, so that it is possible to determine the presence of an abnormal event in the magnetic sensor 2 from the abnormal-event determination signal.

An amount of phase shift of 4.5° is equivalent to a phase difference of 175.5° or 184.5° of the second detection signal S2 with respect to the first detection signal S1. As illustrated in broken lines in FIG. 22, a phase difference of 184.5° is equivalent to a dp/α of 1.25%. Thus, the positional difference dp needs to be smaller than or equal to 1.25% of the angle α or one pitch so that the phase difference falls within the range of 175.5° to 184.5°. Specifying the positional difference dp in this manner makes it possible to determine the presence of an abnormal event in the magnetic sensor 2 from the abnormal-event determination signal.

If an abnormal event occurs in the first or second detection circuit 10 or 20 due to a break inside one of the MR element arrays R11, R12, R21 and R22, the difference between the center level of the abnormal-event determination signal Sa5 under normal conditions and the center level of the abnormal-event determination signal Sa6 under abnormal conditions is greater, that is, the range of the abnormal-event determination signal Sa5 under normal conditions and the range of the abnormal-event determination signal Sa6 under abnormal conditions are less likely to overlap each other, when compared with the case where one of the MR elements 50 is short-circuited. Further, as the number of the MR elements 50 constituting each of the MR element arrays R11, R12, R21 and R22 decreases and the number of short-circuited MR elements 50 increases, the difference between the center level of the abnormal-event determination signal Sa5 under normal conditions and the center level of the abnormal-event determination signal Sa6 under abnormal conditions increases, that is, the range of the abnormal-event determination signal Sa5 under normal conditions and the range of the abnormal-event determination signal Sa6 under abnormal conditions are less likely to overlap each other. Typically, about up to twenty MR elements 50 may be thought to be sufficient to constitute each of the MR element arrays R11, R12, R21 and R22. Thus, an amount of phase shift of 4.5° or less, which has been determined under the conditions that the number of the MR elements 50 constituting each of the MR element arrays R11, R12, R21 and R22 is twenty and the number of short-circuited MR elements 50 is one, is an appropriate value as an allowable amount of phase shift.

In the fourth embodiment, the magnetization pinned layers of the MR elements 50 included in the second detection circuit 20 may be magnetized in directions the same as those in the third embodiment so that the abnormal-event determination signal Sa and the third detection signal Sb can be generated by the same computation as that in the third embodiment. In such a case, the relationship between the positional difference dp and the phase difference of the second detection signal S2 with respect to the first detection signal S1 is the same as that shown in FIG. 22 except that each value on the vertical axis of FIG. 22 is reduced by 180°. Further, the relationship between the minimum value Va and the maximum value Vb is the same as that shown in FIG. 24 except that the phase difference of the second detection signal S2 with respect to the first detection signal S1 is the amount of phase shift of FIG. 24. Thus, in this case, in order to make it possible to determine the presence of an abnormal event in the magnetic sensor 2 from the abnormal-event determination signal, it is required that the phase difference of the second detection signal S2 with respect to the first detection signal S1 fall within the range of −4.5° to 4.5°.

The rotating body serving as the scale 1 of the fourth embodiment may be the gear 6 described in the second embodiment section. The remainder of configuration, function and effects of the fourth embodiment are similar to those of any of the first to third embodiments.

[Fifth Embodiment]

Figure 25:
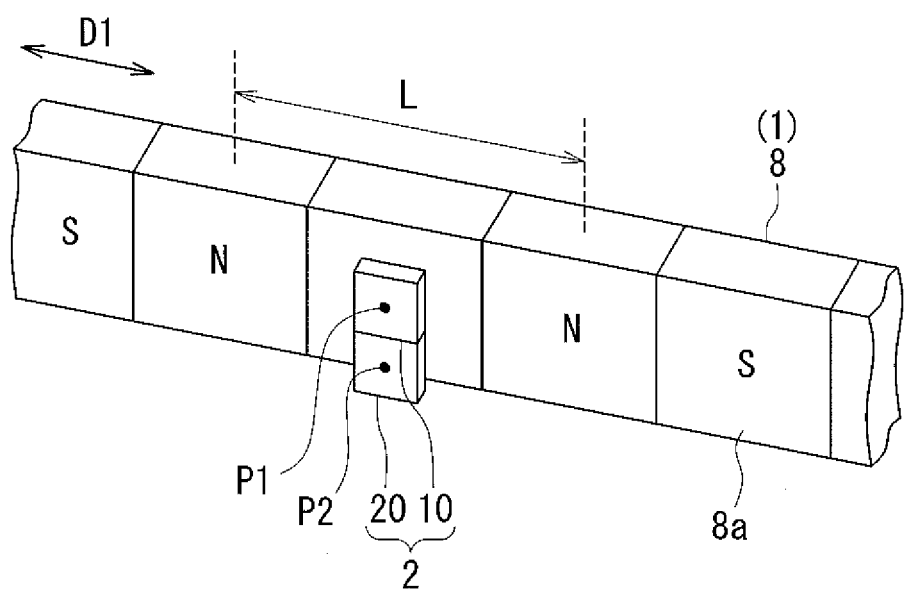
FIG. 25 is a perspective view illustrating the general configuration of a magnetic sensor system according to a fifth embodiment of the invention.

A fifth embodiment of the invention will now be described with reference to FIG. 25. FIG. 25 is a perspective view illustrating the general configuration of a magnetic sensor system according to the fifth embodiment. The magnetic sensor system according to the fifth embodiment differs from that according to the first embodiment in the following ways. In the magnetic sensor system according to the fifth embodiment, the scale 1 is a linear scale 8 having a plurality of pairs of N and S poles arranged alternately in a linear configuration. In the example shown in FIG. 25, the linear scale 8 has a side surface 8a parallel to the direction in which the N and S poles are arranged. The magnetic sensor 2 is disposed to face the side surface 8a of the linear scale 8.

One of the linear scale 8 and the magnetic sensor 2 moves linearly in response to the movement of a moving object (not illustrated). This changes the relative positional relationship between the scale 1 and the magnetic sensor 2. The magnetic sensor system detects the relative position and/or speed of the linear scale 8 with respect to the magnetic sensor 2 as the physical quantity associated with the relative positional relationship between the scale 1 and the magnetic sensor 2. The first direction D1, in which the relative positional relationship between the scale 1 and the magnetic sensor 2 varies, is the direction in which the N and S poles of the linear scale 8 are arranged.

The first detection circuit 10 of the magnetic sensor 2 is disposed at a first position P1 and detects a first magnetic field applied to the first detection circuit 10. The second detection circuit 20 of the magnetic sensor 2 is disposed at a second position P2 and detects a second magnetic field applied to the second detection circuit 20. The first position P1 and the second position P2 are the same in the first direction D1. In the example shown in FIG. 25, the first position P1 and the second position P2 are the same in a direction orthogonal to the side surface 8a, and are different in the vertical direction in FIG. 25.

In the fifth embodiment, each of the first and second magnetic fields is produced by the linear scale 8 and changes its direction as the linear scale 8 moves. Although not illustrated, the direction of the first magnetic field rotates about the first position P1 in a plane perpendicular to the side surface 8a and parallel to the first direction D1. The direction of the second magnetic field rotates about the second position P2 in the plane perpendicular to the side surface 8a and parallel to the first direction D1.

As has been described in the first embodiment section, one pitch is the amount of a change in the relative positional relationship between the scale 1 and the magnetic sensor 2 that changes the direction of each of the first and second magnetic fields by one period. In the fifth embodiment, one pitch is the distance L between the centers of two adjacent N poles of the linear scale 8.

Each of the first detection circuit 10 and the second detection circuit 20 includes the MR elements 50 described in the first embodiment section (see FIG. 5). The first and second detection circuits 10 and 20 are disposed such that the plane of the layers constituting the MR elements 50 included therein is parallel to the side surface 8a of the linear scale 8.

The first and second detection circuits 10 and 20 of the fifth embodiment may be configured in the same manner as the example shown in FIG. 4 described in the first embodiment section. In this case, the first and second detection circuits 10 and 20 may be disposed such that the first direction D1 of the fifth embodiment is parallel to the X direction shown in FIG. 4 and that the direction orthogonal to the side surface 8a of the linear scale 8 is parallel to the Y direction shown in FIG. 4. Further, the magnetic sensor system according to the fifth embodiment may have the same circuit configuration as the example shown in FIG. 6 or FIG. 7 described in the first embodiment section.

Further, in the fifth embodiment, the magnetization pinned layers of the MR elements 50 included in the second detection circuit 20 may be magnetized in directions the same as those in the example of FIG. 18 described in the third embodiment section so that the abnormal-event determination signal Sa and the third detection signal Sb can be generated by the same computation as that in the third embodiment. The remainder of configuration, function and effects of the fifth embodiment are similar to those of the first or third embodiment.

[Sixth Embodiment]

Figure 26:
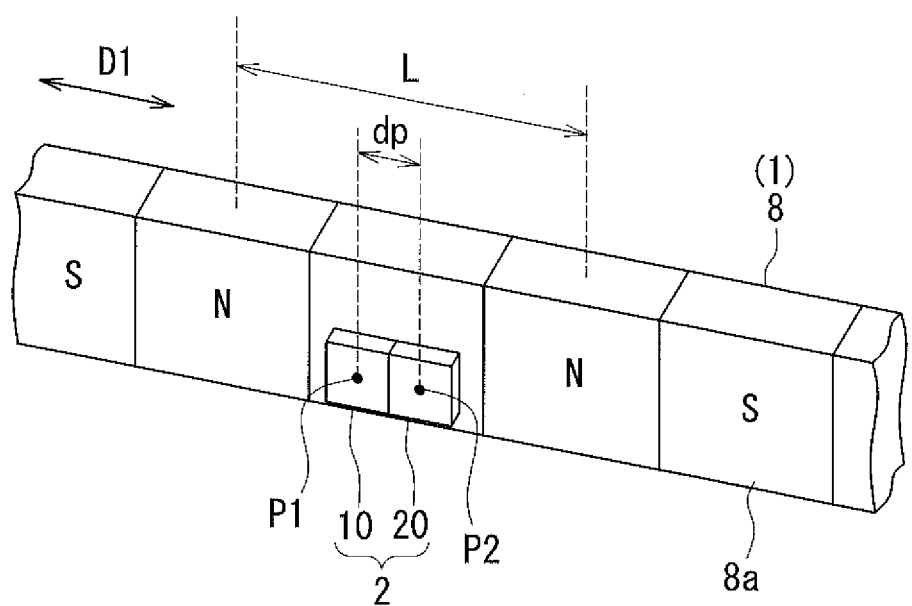
FIG. 26 is a perspective view illustrating the general configuration of a magnetic sensor system according to a sixth embodiment of the invention.

A sixth embodiment of the invention will now be described with reference to FIG. 26. FIG. 26 is a perspective view illustrating the general configuration of a magnetic sensor system according to the sixth embodiment. Differences of the magnetic sensor system according to the sixth embodiment from the magnetic sensor system according to the fifth embodiment will be described below. In the sixth embodiment, as shown in FIG. 26, the first position P1 and the second position P2 are different in the first direction D1. In the example shown in FIG. 26, the first position P1 and the second position P2 are the same in the direction orthogonal to the side surface 8a of the linear scale 8 and in the vertical direction in FIG. 26.

As with the fourth embodiment, the positional difference dp, i.e., the difference between the first position P1 and the second position P2 in the first direction D1, is smaller than or equal to 1.25% of one pitch or the distance L.

The first and second detection circuits 10 and 20 of the sixth embodiment may be configured in the same manner as the example shown in FIG. 21 described in the fourth embodiment section. In this case, the first and second detection circuits 10 and 20 may be disposed such that the first direction D1 of the sixth embodiment is parallel to the X direction shown in FIG. 21 and that the direction orthogonal to the side surface 8a of the linear scale 8 is parallel to the Y direction shown in FIG. 21.

The remainder of configuration, function and effects of the sixth embodiment are similar to those of the fourth or fifth embodiment.

The present invention is not limited to the foregoing embodiments, and various modifications may be made thereto. For example, as far as the requirements of the appended claims are met, the layout of the first and second detection circuits 10 and 20 is not limited to the examples illustrated in the foregoing embodiments but can be chosen as desired. For example, the first detection circuit 10 and the second detection circuit 20 may be stacked on each other.

It is apparent that the present invention can be carried out in various forms and modifications in the light of the foregoing descriptions. Accordingly, within the scope of the following claims and equivalents thereof, the present invention can be carried out in forms other than the foregoing most preferable embodiments.

What is claimed is:

1. A magnetic sensor system comprising a scale and a magnetic sensor that are arranged in a relative positional relationship variable in a first direction, the magnetic sensor system being configured to detect a physical quantity associated with the relative positional relationship between the scale and the magnetic sensor, wherein
the magnetic sensor includes a first detection circuit disposed at a first position and a second detection circuit disposed at a second position,
the first detection circuit outputs a first detection signal that varies depending on a first magnetic field applied to the first detection circuit,
the second detection circuit outputs a second detection signal that varies depending on a second magnetic field applied to the second detection circuit, each of the first and second detection circuits includes a plurality of magnetoresistive elements connected in series, each of the plurality of magnetoresistive elements includes: a magnetization pinned layer having a magnetization in a pinned direction; a free layer having a magnetization that varies depending on an applied magnetic field; and a tunnel barrier layer interposed between the magnetization pinned layer and the free layer, each of the first and second magnetic fields changes its direction periodically in response to a change in the relative positional relationship between the scale and the magnetic sensor, and the first position and the second position differ from each other by 1.25% of one pitch or less, where one pitch is an amount of a change in the relative positional relationship between the scale and the magnetic sensor that changes the direction of each of the first and second magnetic fields by one period, the magnetic sensor system further comprising a computing unit, the computing unit being configured to generate an abnormal-event determination signal by computation using the first detection signal and the second detection signal, and to determine whether the magnetic sensor is normal or has an abnormal event by monitoring whether the abnormal-event determination signal falls within a predetermined range specified by an upper limit and a lower limit, the upper limit and the lower limit being established to determine the presence of an abnormal event in the first or second detection circuit caused by a short circuit between the magnetization pinned layer and the free layer in one of the plurality of magnetoresistive elements included in the first or second detection circuit, and to thereby allow for determination of an abnormal event in the magnetic sensor.

2. The magnetic sensor system according to claim 1, wherein the second detection signal has a phase difference of 175.5° to 184.5° with respect to the first detection signal, and the computation by the computing unit includes determining a sum of the first detection signal and the second detection signal.

3. The magnetic sensor system according to claim 1, wherein the second detection signal has a phase difference of −4.5° to 4.5° with respect to the first detection signal, and the computation by the computing unit includes determining a difference between the first detection signal and the second detection signal.

4. The magnetic sensor system according to claim 1, wherein the first position and the second position are the same in the first direction.

5. The magnetic sensor system according to claim 1, wherein the scale is a rotating body that rotates about a predetermined central axis, the rotation of the rotating body changes the relative positional relationship between the scale and the magnetic sensor, the first direction is a direction of rotation of the rotating body, and the one pitch is expressed in an angle in the direction of rotation of the rotating body.

6. The magnetic sensor system according to claim 5, wherein the rotating body has a plurality of pairs of N and S poles alternately arranged in a circumferential direction, each of the first and second magnetic fields is produced by the rotating body and changes its direction as the rotating body rotates, and the one pitch is an angle formed by two straight lines that connect the central axis to centers of two adjacent N poles of the rotating body.

7. The magnetic sensor system according to claim 5, wherein the rotating body is a gear having teeth formed of a magnetic material, the magnetic sensor system further comprises a magnet having a fixed positional relationship with the magnetic sensor, each of the first and second magnetic fields is produced by the magnet and changes its direction as the gear rotates, and the one pitch is an angle formed by two straight lines that connect the central axis to centers of two adjacent teeth.

8. The magnetic sensor system according to claim 1, wherein the scale has a plurality of pairs of N and S poles arranged alternately in a linear configuration, the first direction is a direction in which the N and S poles of the scale are arranged, each of the first and second magnetic fields is produced by the scale, and the one pitch is a distance between centers of two adjacent N poles of the scale.

* * * * *